(12) United States Patent
Nam et al.

(10) Patent No.: US 12,124,789 B2
(45) Date of Patent: Oct. 22, 2024

(54) MULTI-STAGE ELECTRONIC DESIGN AUTOMATION PARAMETER TUNING

(71) Applicant: International Business Machines Corporation, Armonk, NY (US)

(72) Inventors: Gi-Joon Nam, Chappaqua, NY (US); Jinwook Jung, Somers, NY (US); Alexey Y. Lvov, Congers, NY (US); Lakshmi N. Reddy, Mount Kisco, NY (US); Hua Xiang, Ossining, NY (US); Rongjian Liang, College Station, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 470 days.

(21) Appl. No.: 17/645,093

(22) Filed: Dec. 20, 2021

(65) Prior Publication Data

US 2023/0195993 A1  Jun. 22, 2023

(51) Int. Cl.
*G06F 30/398* (2020.01)

(52) U.S. Cl.
CPC .................... *G06F 30/398* (2020.01)

(58) Field of Classification Search
USPC ........................................................ 716/106
See application file for complete search history.

(56) References Cited

U.S. PATENT DOCUMENTS

| 9,672,317 | B2 | 6/2017 | Ramachandran et al. |
| 9,836,565 | B2 | 12/2017 | Kang |
| 10,643,011 | B1 | 5/2020 | Nardi et al. |
| 2008/0168410 | A1 | 7/2008 | Pikus et al. |
| 2019/0347138 | A1 | 11/2019 | Gibson et al. |
| 2022/0004900 | A1* | 1/2022 | Salahuddin ............. G06F 30/31 |

FOREIGN PATENT DOCUMENTS

| CN | 110378462 A | 10/2019 |
| CN | 112988143 B | 6/2021 |
| CN | 113158599 A | 7/2021 |

OTHER PUBLICATIONS

A. Agnesina, K. Chang, and S. K. Lim, "VLSI placement parameter optimization using deep reinforcement learning," in Proc. ICCAD, Nov. 2020, pp. 1-9.

(Continued)

*Primary Examiner* — Bryce M Aisaka
(74) *Attorney, Agent, or Firm* — Amin, Turocy & Watson, LLP

(57) ABSTRACT

Techniques regarding parameter tuning for an EDA protocol are provided. For example, one or more embodiments described herein can comprise a system, which can comprise a memory that can store computer executable components. The system can also comprise a processor, operably coupled to the memory, and that can execute the computer executable components stored in the memory. The computer executable components can comprise a tuning component that tunes an electronic design automation protocol via a cooperative co-evolutionary optimization framework that shares parameter knowledge across multiple stages of the electronic design automation protocol.

20 Claims, 15 Drawing Sheets

(56) References Cited

OTHER PUBLICATIONS

H.-Y. Liu and L.P. Carloni, "On learning-based methods for design-space exploration with high-level synthesis," in Proc. DAC, May 2013, pp. 1-7.

Z. Wang and B. C. Schafer, "Machine learning to set meta-heuristic specific parameters for high-level synthesis design space exploration," in Proc. DAC, Jul. 2020, pp. 1-6.

Xie, Zhiyao, Guan-Qi Fang, Yu-Hung Huang, Haoxing Ren, Yanqing Zhang, Brucek Khailany, Shao-Yun Fang, Jiang Hu, Yiran Chen, and Erick Carvajal Barboza. "FIST: A feature-importance sampling and tree-based method for automatic design flow parameter tuning." In 2020 25th Asia and South Pacific Design Automation Conference (ASP-DAC), pp. 19-25. IEEE, 2020.

Xu, Chang, Gai Liu, Ritchie Zhao, Stephen Yang, Guojie Luo, and Zhiru Zhang. "A parallel bandit-based approach for autotuning fpga compilation." In Proceedings of the 2017 ACM/SIGDA international symposium on field-programmable gate arrays, pp. 157-166. 2017.

Ustun, Ecenur, Shaojie Xiang, Jinny Gui, Cunxi Yu, and Zhiru Zhang. "Lamda: Learning-assisted multi-stage autotuning for fpga design closure." In 2019 IEEE 27th Annual International Symposium on Field-Programmable Custom Computing Machines (FCCM), pp. 74-77. IEEE, 2019.

A. B. Kahng, S. Kumar, and T. Shah, "A no-human-in-the-loop methodology toward optimal utilization of EDA tools and lows," in Proc. DAC WIP, Jun. 2018, pp. 1-6.

Y. Ma, Z. Yu, and B. Yu, "CAD tool design space exploration via bayesian optimization," in Proc. MLCAD, Sep. 2019, pp. 1-6.

M. K. Papamichael, p. Milder, and J. C. Hoe, "Nautilus: Fast automated IP design space search using guided genetic algorithms," in Proc. DAC, Jun. 2015, pp. 1-6.

iwls.org, "IWLS 2005 Benchmarks," https://iwls.org/iwls2005/benchmarks.html, Jun. 2005.

M. M. Ziegler et al., "A synthesis-parameter tuning system for autonomous design-space exploration," in Proc. Date, Mar. 2016, pp. 1148-1151.

J. Kwon, M. M. Ziegler, and L. P. Carloni, "A learning-based recommender system for autotuning design flows of industrial high-performance processors," in Proc. DAC, Jun. 2019, pp. 1-6.

ITRS, "ITRS Reports—ITRS 2.0 Publication," 2015, http://www.itrs2.net/itrs-reports.html.

P. Meng et al., "Adaptive threshold non-Pareto elimination: Rethinking machine learning for system level design space exploration on FPGAs," in Proc. Date, Mar. 2016, pp. 918-923.

X. Ma et al., "A survey on cooperative co-evolutionary algorithms," IEEE Trans. Evol. Comput., vol. 23, No. 3, pp. 421-441, Sep. 2018.

A' . Fialho et al., "Comparison-based adaptive strategy selection with bandits in differential evolution," in Proc. PPSN, Sep. 2010, pp. 194-203.

M. Munetomo and D. E. Goldberg, "Linkage identification by non-monotonicity detection for overlapping functions," Evol. Comput., vol. 7, No. 4, pp. 377-398, Dec. 1999.

L. T. Clark et al., "ASAP7: A 7-nm finFET predictive process design kit," Microelect. Journ., vol. 53, No. 1, pp. 105-115, Jul. 2016.

Github, "Bayesian Optimization," Retrieved from the Internet: Dec. 16, 2021, https://github.com/fmfn/BayesianOptimization.

Mell et al., The NIST Definition of Cloud Computing, Recommendations of the National Institute of Standards and Technology, NIST Special Publication 800-145, Sep. 2011, 7 pages.

\* cited by examiner

Pseudo Code 302

```
Input:  M: number of stages; L: number of epochs;
        n_1, n_2, ..., n_L: number of trials in each epoch;
        w_0 = [w_0, w_1, ..., w_M], Σ_i w_i = 1: initial stage importance;
        F_0 = [f_1^0, f_2^0, ..., f_M^0]: initial configuration
Output: r_best: best reward obtained
        R = [r_1, r_2, ..., r_M]: best parameter configuration
1   Initialize: r_best ← initial reward; R ← F_0; w ← w_0
    /* Perform L tuning epochs */
2   for l ← 1 to L do
        /* Allocate resource based on stage importance */
3       a ← [a_1, a_2, ..., a_M], where a_i = round(w_i n_l) is the number of
          trials allocated to stage i, and round(x) means rounding x to an integer
4       r_temp ← r_best
5       stage list s_list = [ ]; reward list r_list = [ ]
        /* Perform one epoch of stage-by-stage tuning,
           containing n_l = a_1 + a_2 + ... + a_M trials */
6       for i ← 1 to M do
            /* Perform a_i trials of tuning for stage i */
7           for j ← 1 to a_i do
                /* Suggest a new configuration */
8               unvisited ← False
9               while not unvisited do
10                  The i-th ACO engine suggests a partial configuration f_i
11                  F ← [r_1, ..., r_{i-1}, f_i, r_{i+1}, ..., r_M]
12                  if F has not been visited then
13                      unvisited ← True
14                  end
15              end
16              Pass F to the Flow Controller to get the final QoR
                /* Parse QoR and update ACO engine */
17              if final QoR is obtained then
18                  Calculate reward r according to final QoR
19                  Update the pheromones of the i-th ACO engine based on r
20                  if r > r_best then
21                      r_best ← r; R ← F
22                  end
                    /* Calculate reward improvement */
23                  r_imp ← max(r − r_temp, 0)
24                  Append i to s_list and r_imp to r_list
25              end
26          end
27          r_temp ← r_best
28      end
        /* Update the stage importance */
29      for i ← 1 to M do
30          u_i ← F-AUC of stage i, computed from s_list and r_list
31          w_i ← (w_i + u_i)/2
32      end
33  end
```

FIG. 3

Pseudo Code 602

```
Input: F = {f_1, f_2 ..., f_M}: a new configuration;
       r_best: best reward obtained;
       Λ = {F_1 : SynRe1; F_2 : SynRe2 ...}: repository of design
       outcomes, where F_i, i = 1, 2 ... is the configuration of a previous trial
       and SynRe is its outcome;
       Φ = {φ_1, φ_2 ..., φ_{M-1}}: a set of models for reward upper bound
       prediction, where φ_i, i = 1, 2 ..., M - 1, is the model for predicting
       the final (post-route) reward upper bound after stage i;
       Ω = {ω_1, ω_2 ..., ω_{M-1}}: collection of QoR data, where ω_i contains
       a set of data pairs (QoR after stage i, final QoR) for the
       training/parameter estimation of prediction model φ_i
Output: final QoR or None;
        Updated r_best, Λ, Φ and Ω
  /* Flow jump start */
1 Query the collection Λ to find k* = max_{k∈[2,M]} k
    s.t. ∃F' = {f'_1, f'_2 ..., f'_M} ∈ Λ and ∀i ∈ [1, k − 1], f'_i = f_i
2 if k* can be found successfully then
3  |  Fetch the synthesis result after the (k* − 1)-th stage for F' from Λ
4 else
5  |  k* ← 1
6 end
7 Start a new flow thread from the k*-th stage
  /* Flow early stop */
8 for i ← k* to M − 1 do
9  |  Run the i-th stage and collect intermediate QoR after stage i
   |    /* FlowTuner does not conduct early stop until
   |       there exist enough data pairs in ω_i to train φ_i
   |       to estimate the reward bound effectively */
10 |  if |ω_i| < 10 then
11 |  |  continue
12 |  end
13 |  Feed the intermediate QoR to model φ_i to get an estimation of reward
   |    upper bound r̂
14 |  if r̂ < r_best then
15 |  |  return None, r_best, Λ, Φ and Ω
16 |  end
17 end
   /* Update r_best, Λ, Φ and Ω */
18 Run the M-th stage and collect the final QoR r
19 if r > r_best then
20 |  r_best ← r
21 end
22 Add synthesis results and QoR results to Λ and Ω, respectively
23 Update models in Φ with dataset Ω
24 return final QoR, r_best, Λ, Φ and Ω
```

FIG. 6

TABLE 1000

BENCHMARK CIRCUITS

|  | ID | Name | #Cells | Clock Period (ps) |
|---|---|---|---|---|
| Legacy design | 1 | wb_dma | 2792 | 280 |
| | 2 | des3_area | 3097 | 730 |
| | 3 | systemcdes | 3249 | 300 |
| | 4 | systemcaes | 5353 | 480 |
| | 5 | mem_ctrl | 6985 | 300 |
| | 6 | ac97_ctrl | 9467 | 180 |
| | 7 | aes_core | 14737 | 420 |
| | 8 | b17 | 15696 | 470 |
| | 9 | wb_conmax | 18753 | 600 |
| | 10 | b18 | 27113 | 810 |
| | 11 | fpu_double | 49123 | 330 |
| Testing design | 12 | ethernet | 10990 | 280 |
| | 13 | b19 | 48398 | 1200 |
| | 14 | vga_lcd | 59498 | 320 |
| | 15 | FFT_64 | 59551 | 500 |
| | 16 | FFT_128 | 125558 | 360 |

TABLE 1002

FLOW PARAMETERS WITH BASELINE SETTINGS HIGHLIGHTED IN BOLD

| Stage | ID | Parameter | Option |
|---|---|---|---|
| syn | 1 | syn_generic_effort | high, medium, low |
| | 2 | syn_map_effort | high, medium, low |
| | 3 | tns_critical_range | 0, 8, 15 |
| | 4 | optimize_net_area | true, false |
| | 5 | syn_opt_effort | extreme, high, medium, low |
| place | 6 | place_detail_wire_length_opt_effort | high, medium, none |
| | 7 | place_global_cong_effort | auto, high, medium, low |
| | 8 | place_global_max_density | 1.0, 0.9, 0.8 |
| place_opt | 9 | maxDensity | 0.95, 0.9, 0.8 |
| | 10 | powerEffort | none, low, high |
| | 11 | reclaimArea | true, false |
| cts | 12 | auto_limit_insertion_delay | 1.4, 1.2, 1.0 |
| | 13 | cell_density | 0.95, 0.9, 0.8 |
| cts_opt | 14 | maxDensity | 0.95, 0.9, 0.8 |
| | 15 | powerEffort | none, low, high |
| | 16 | reclaimArea | true, false |
| route | 17 | postRouteReclaim | none, setupAware, holdAndSetupAware |
| | 18 | routeWithTimingDriven | true, false |
| route_opt | 19 | maxDensity | 0.95, 0.9, 0.8 |
| | 20 | powerEffort | none, low, high |
| | 21 | reclaimArea | true, false |

FIG. 10

| Des | Metric | Baseline | BO | Recommender | FIST | TUNING COMPONENT 110 W/O KNOWLEDGE TRANSFER | TUNING COMPONENT 110 WITH KNOWLEDGE TRANSFER |
|---|---|---|---|---|---|---|---|
| 12 | TNS/ns | -5,028 | -3,502 (30.35%) | -3,308 (32.42%) | -2,035 (59.53%) | -2,425 (51.77%) | -1,299 (74.16%) |
|  | WNS/ps | -50 | -46 (8.00%) | -28 (44.00%) | -31 (38.00%) | -30 (40.00%) | -22 (56.00%) |
|  | P/mW | 19,346 | 19,082 (1.36%) | 19,101 (1.27%) | 19,199 (0.76%) | 19,153 (1.00%) | 18,878 (2.42%) |
| 13 | TNS/ns | -0.463 | -0.005 (98.92%) | -0.010 (97.84%) | -0.011 (97.62%) | -0.061 (86.83%) | -0.009 (98.06%) |
|  | WNS/ps | -32 | -1 (96.88%) | -2 (93.75%) | -2 (93.75%) | -6 (81.25%) | -2 (93.75%) |
|  | P/mW | 15,302 | 15,491 (-1.24%) | 15,054 (1.62%) | 15,430 (-0.84%) | 15,285 (0.11%) | 15,025 (1.75%) |
| 14 | TNS/ns | -4,896 | -0,976 (89.03%) | -0,577 (93.51%) | -0,952 (80.99%) | -0.591 (93.30%) | -0,540 (93.97%) |
|  | WNS/ps | -27 | -25 (7.41%) | -29 (-7.41%) | -42 (-55.56%) | -33 (-22.22%) | -10 (62.96%) |
|  | P/mW | 116,035 | 103,608 (10.81%) | 103,008 (11.23%) | 103,292 (10.98%) | 105,857 (8.77%) | 102,850 (11.36%) |
| 15 | TNS/ns | -0.397 | -0,065 (95.16%) | -0,047 (92.15%) | -0,014 (97.65%) | -0.020 (96.65%) | -0,003 (99.50%) |
|  | WNS/ps | -22 | -1 (95.45%) | -9 (11.11%) | -7 (22.22%) | -7 (81.82%) | -3 (86.36%) |
|  | P/mW | 67,358 | 68,073 (1.91%) | 67,57 (-0.31%) | 65,188 (3.22%) | 64,833 (3.75%) | 65,959 (2.08%) |
| 16 | TNS/ns | -2,092 | -0,344 (83.56%) | -0,448 (78.59%) | -0,610 (70.84%) | 0,148 (92.93%) | -0,101 (95.17%) |
|  | WNS/ps | -18 | -12 (33.33%) | -16 (11.11%) | -14 (22.22%) | -10 (44.44%) | -9 (50.00%) |
|  | P/mW | 193,228 | 190,773 (1.27%) | 188,739 (2.32%) | 191,803 (0.74%) | 192,667 (0.29%) | 190,324 (1.50%) |
| Average TNS reduction |  |  | 80.26% | 78.90% | 82.99% | 84.31% | 92.16% |
| Average WNS reduction |  |  | 48.21% | 40.19% | 55.54% | 45.06% | 69.82% |
| Average Power reduction |  |  | 2.82% | 3.23% | 2.97% | 2.79% | 3.83% |

FIG. 11

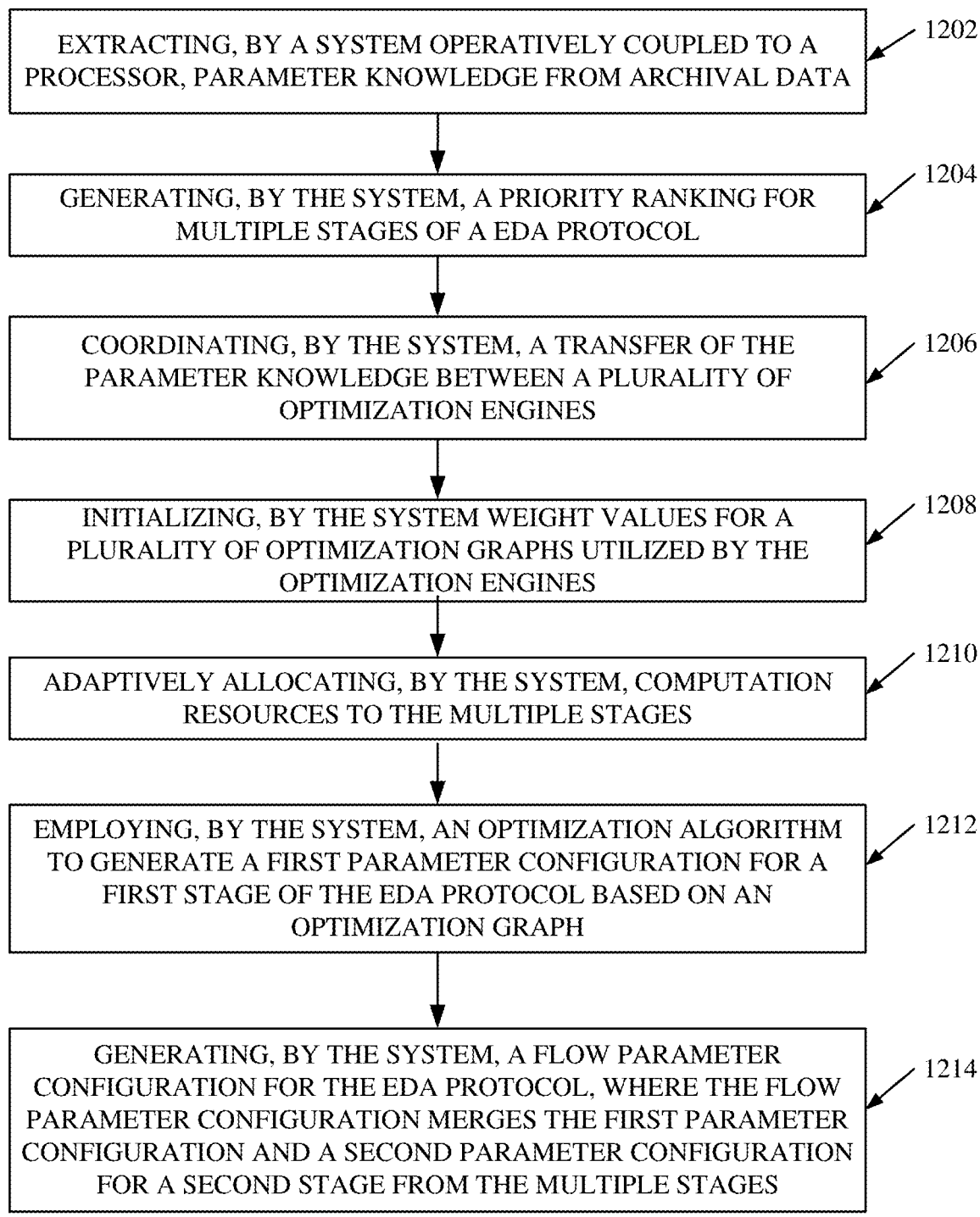

MULTI-STAGE ELECTRONIC DESIGN AUTOMATION PARAMETER TUNING

BACKGROUND

The subject disclosure relates to one or more multi-stage electronic design automation ("EDA") parameter tuning, and more specifically, to utilizing a multi-stage cooperative co-evolutionary framework to explore a parameter space and tune one or more parameters of one or more EDA protocols.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses and/or computer program products that can tune one or more parameter configurations of an EDA protocol are described.

According to an embodiment, a system is provided. The system can comprise a memory that can store computer executable components. The system can also comprise a processor that can execute the computer executable components stored in the memory. The computer executable components can comprise a tuning component that tunes an electronic design automation protocol via a cooperative co-evolutionary optimization framework that shares parameter knowledge across multiple stages of the electronic design automation protocol.

According to an embodiment, a computer-implemented method is provided. The computer-implemented method can comprise tuning, by a system operatively coupled to a processor, an electronic design automation protocol via a cooperative co-evolutionary optimization framework that shares parameter knowledge across multiple stages of the electronic design automation protocol.

According to an embodiment, a computer program product for electronic design automation parameter tuning is provided. The computer program product can comprise a computer readable storage medium having program instructions embodied therewith. The program instructions can be executable by a processor to cause the processor to tune, by the processor, an electronic design automation protocol via a cooperative co-evolutionary optimization framework that shares parameter knowledge across multiple stages of the electronic design automation protocol.

BRIEF DESCRIPTION OF THE DRAWINGS

FIG. 3 illustrates a diagram of an example, non-limiting first pseudo code that can describe one or more operations of a cooperative co-evolutionary controller component, which can be employed to tune one or more parameters of a multi-stage EDA protocol in accordance with one or more embodiments described herein.

FIG. 6 illustrates a diagram of an example, non-limiting second pseudo code that can describe one or more operations of a flow controller component, which can be employed to tune one or more parameters of a multi-stage EDA protocol in accordance with one or more embodiments described herein.

FIGS. 10-11 illustrate diagrams of example, non-limiting tables that can demonstrate the efficacy of tuning one or more parameters of a multi-stage EDA protocol in accordance with one or more embodiments described herein.

FIG. 12 illustrates a flow diagram of an example, non-limiting computer-implemented method that can facilitate employing a cooperative co-evolutionary framework to tune one or more parameters of a multi-stage EDA protocol in accordance with one or more embodiments described herein.

DETAILED DESCRIPTION

Figure 1:
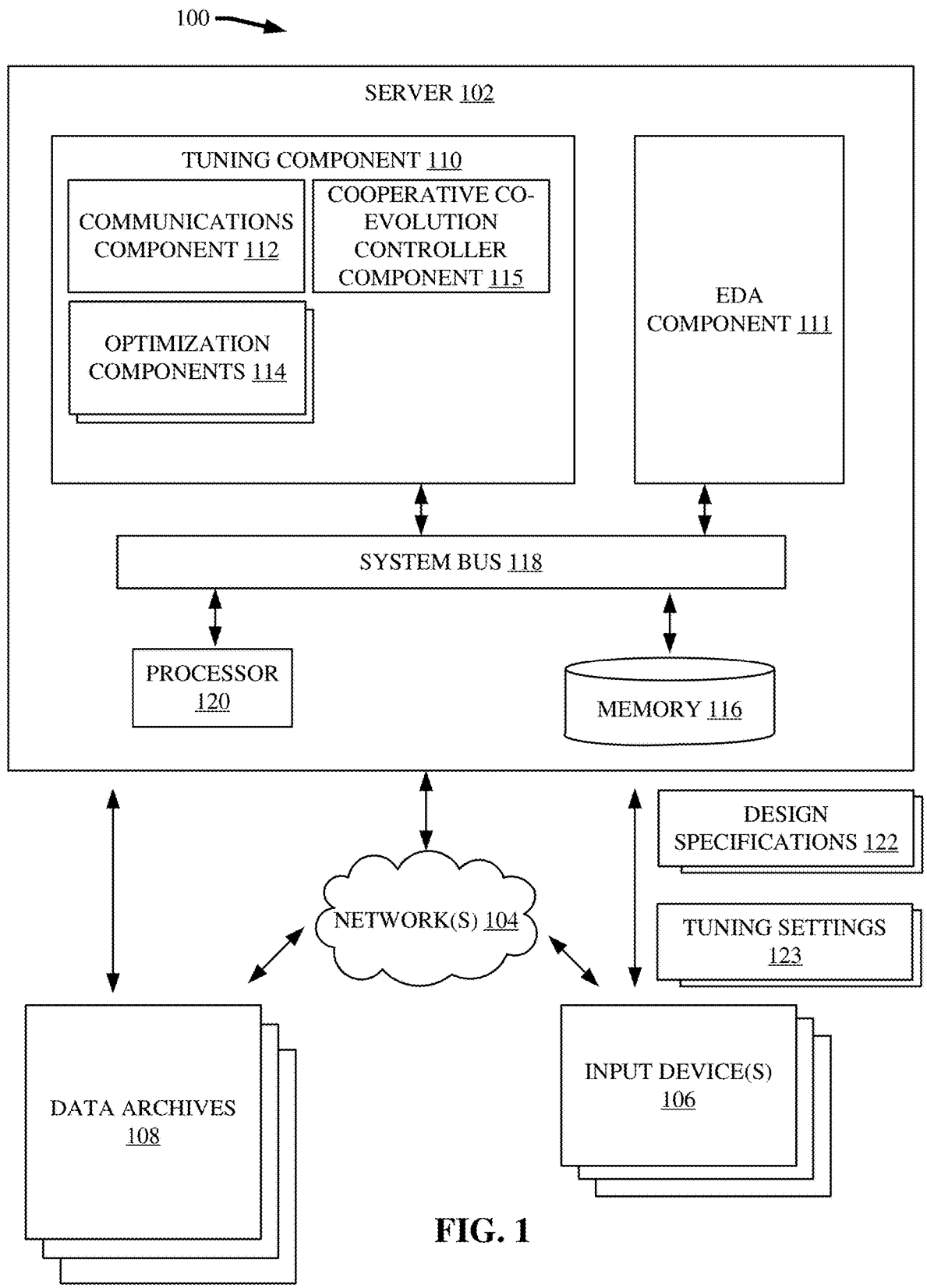
FIG. 1 illustrates a block diagram of an example, non-limiting system that can tune one or more parameters of a multi-stage EDA protocol in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The capabilities of EDA tools and flows have evolved with a myriad of parameters and options to cope with the increased complexity and scale of designs; thereby establishing an expanded design solution space that can require experienced designers' intuitions and knowledge to utilize the full potential of EDA tools. For example, in high performance micro-processor designs, it is not uncommon to have significantly different power-performance-area ("PPA") results on the same design with different settings of parameters. In order to navigate the solution space in a more systematic and intelligent manner, automatic flow parameter tuning can be employed to find an optimal parameter configuration for a given design. However, typical techniques can either target at a single stage of the EDA flow (e.g., thus missing significant opportunities of cross-stage optimization), or tune flow parameters of multiple stages as a whole, thereby coping with an extraordinarily huge search space. Additionally, typical techniques can fail to address the runtime of the EDA protocol.

Various embodiments of the present invention can be directed to computer processing systems, computer-implemented methods, apparatus and/or computer program products that facilitate the efficient, effective, and autonomous (e.g., without direct human guidance) parameter tuning for one or more EDA protocols. For example, one or more embodiments described herein can enable effective and/or efficient design flow tuning capability by utilizing transferred knowledge from archival design data and/or exploration of the parameter space via a multi-stage cooperative co-evolutionary optimization framework. Additionally, one or more embodiments described herein can enhance computation resource management via one or more jump-start techniques and/or early-stop techniques.

For instance, various embodiments described herein can utilize a cooperative co-evolutionary optimization framework for parameter exploration in a multi-stage design solution space. The cooperative co-evolutionary optimization framework can map the flow parameters for each stage of the EDA protocol and/or tune the parameters based on, for example, one or more quality-of-result ("QoR") metric values. Example QoR metric can include, but are not limited to: clock frequency, power consumption, total gate area, a combination thereof, and/or the like. At the stage level, an optimization component employing an optimization algorithm, such as ant colony optimization ("ACO"), can be employed. At the multi-stage level, the tuning of multiple design stages can be orchestrated in an interactive and cooperative manner to achieve the target QoR.

In another instance, various embodiments described herein can further utilize the deployment of one or more jump-start techniques and/or early-stop techniques to improve runtime efficiency. Jump-start techniques can actively utilize reusable design outcomes to facilitate selective allocation of computation resources to targeted parameters and/or stages of the EDA protocol. Early-stop techniques can employ a branch-and-bound strategy integrated with a probabilistic reward upper bound prediction technique to systematically prune non-promising parameter configurations prematurely (e.g., prior to the scheduled termination of the EDA protocol).

Moreover, various embodiments described herein can extract knowledge from one or more data archives to facilitate the parameter tuning. For example, historic knowledge regarding the importance, bias, and/or interaction of one or more parameters can be extracted and utilized to initialize one or more optimization algorithms employed during the parameter tuning.

The computer processing systems, computer-implemented methods, apparatus and/or computer program products employ hardware and/or software to solve problems that are highly technical in nature (e.g., EDA parameter tuning), that are not abstract and cannot be performed as a set of mental acts by a human. Also, one or more embodiments described herein can constitute a technical improvement over conventional EDA protocols by transferring knowledge obtained from the generation of past designs. Further, one or more embodiments described herein can have a practical application by tuning parameters to optimize a target evaluation metric associated with the EDA protocol and/or reduce runtime of the EDA protocol. Moreover, one or more embodiments described herein can control a cooperative co-evolutionary framework to optimize one or more parameters utilized in one stage of the EDA protocol while considering the performance of another stage of the EDA protocol.

FIG. 1 illustrates a block diagram of an example, non-limiting system 100 that can tune one or more parameters of an EDA protocol. Repetitive description of like elements employed in other embodiments described herein is omitted for the sake of brevity. Aspects of systems (e.g., system 100 and the like), apparatuses or processes in various embodiments of the present invention can constitute one or more machine-executable components embodied within one or more machines, e.g., embodied in one or more computer readable mediums (or media) associated with one or more machines. Such components, when executed by the one or more machines (e.g., computers, computing devices, virtual machines, a combination thereof, and/or the like) can cause the machines to perform the operations described.

As shown in FIG. 1, the system 100 can comprise one or more servers 102, one or more networks 104, input devices 106, and/or data archives 108. The server 102 can comprise tuning component 110 and/or EDA component 111. The tuning component 110 can further comprise communications component 112, optimization components 114, and/or cooperative co-evolution controller ("CCC") component 115. Also, the server 102 can comprise or otherwise be associated with at least one memory 116. The server 102 can further comprise a system bus 118 that can couple to various components such as, but not limited to, the tuning component 110 and associated components, the EDA component 111, memory 116, and/or a processor 120. While a server 102 is illustrated in FIG. 1, in other embodiments, multiple devices of various types can be associated with or comprise the features shown in FIG. 1. Further, the server 102 can communicate with one or more cloud computing environments.

The one or more networks 104 can comprise wired and wireless networks, including, but not limited to, a cellular network, a wide area network (WAN) (e.g., the Internet) or a local area network (LAN). For example, the server 102 can communicate with the one or more input devices 106, the one or more data archives 108, and/or the EDA component 111 (and vice versa) using virtually any desired wired or wireless technology including for example, but not limited to: cellular, WAN, wireless fidelity (Wi-Fi), Wi-Max, WLAN, Bluetooth technology, a combination thereof, and/or the like. Further, although in the embodiment shown the tuning component 110 can be provided on the one or more servers 102, it should be appreciated that the architecture of system 100 is not so limited. For example, the tuning component 110, or one or more components of tuning component 110, can be located at another computer device, such as another server device, a client device, and/or the like.

The one or more input devices 106 can comprise one or more computerized devices, which can include, but are not limited to: personal computers, desktop computers, laptop computers, cellular telephones (e.g., smart phones), computerized tablets (e.g., comprising a processor), smart watches, keyboards, touch screens, mice, a combination thereof, and/or the like. The one or more input devices 106 can be employed to enter one or more design specifications 122 and/or tuning settings 124 into the system 100, thereby sharing (e.g., via a direct connection and/or via the one or more networks 104) said data with the server 102. For example, the one or more input devices 106 can send data to the communications component 112 (e.g., via a direct connection and/or via the one or more networks 104). Additionally, the one or more input devices 106 can comprise one or more displays that can present one or more outputs generated by the system 100 to a user. For example, the one or more displays can include, but are not limited to: cathode tube display ("CRT"), light-emitting diode display ("LED"), electroluminescent display ("ELD"), plasma display panel ("PDP"), liquid crystal display ("LCD"), organic light-emitting diode display ("OLED"), a combination thereof, and/or the like.

In various embodiments, the one or more input devices 106 and/or the one or more networks 104 can be employed to input one or more settings and/or commands into the system 100. For example, in the various embodiments described herein, the one or more input devices 106 can be employed to operate and/or manipulate the server 102 and/or associate components. Additionally, the one or more input devices 106 can be employed to display one or more outputs (e.g., displays, data, visualizations, and/or the like) generated by the server 102 and/or associate components. Further, in one or more embodiments, the one or more input devices 106 can be comprised within, and/or operably coupled to, a cloud computing environment.

In various embodiments, the one or more design specifications 122 can define one or more aspects of an EDA protocol. For example, an EDA protocol can facilitate in the planning, design, implementation, verification, and/or manufacturing of one or more designs for a semiconductor device. In one or more embodiments, the one or more design specifications 122 can guide execution of the EDA protocol by defining, for example, one or more performance objectives, component density objects, manufacturing requirements, and/or monitoring requirements. For instance, the one or more design specifications 122 can delineate the stages comprised within an EDA protocol. Further, the one or more design specifications 122 can delineate one or more parameters associated with the stages, and/or one or orders of the stages. The EDA component 111 can execute the one or more EDA protocols in accordance with the one or more design specifications 122 and/or one or more parameter configurations generated by the tuning component 110.

In various embodiments, the one or more data archives 108 can be one or more data repositories that can store historical data regarding one or more previously employed parameter configurations, one or more previously executed EDA protocols, and/or one or more final designs generated by an EDA protocol. In various embodiments, one or more outputs of the tuning component 110 and/or EDA component 111 can be stored in the one or more data archives 108. Further, the archival data stored in the one or more data archives 108 can be extracted to derive parameter knowledge that can be transferred to one or more optimization frameworks employed by the tuning component 110. Although FIG. 1 depicts the one or more data archives 108 as separate from the server 102, the architecture of the system 100 is not so limited. For example, embodiments in which the one or more data archives 108 are comprised on the server 102 are also envisaged.

As shown in FIG. 1, the tuning component 110 can comprise one or more optimization components 114. For example, the tuning component 110 can comprise a plurality of optimization components 114, where each optimization component 114 can perform the parameter tuning associated with a designated stage of an EDA protocol (e.g., as defined by the one or more design specifications 122). For instance, where the EDA protocol (e.g., executed by the EDA component 111) comprises M design stages, the tuning component 110 can initiate M optimization components 114. As described further herein, the i-th optimization component 114 can generate a stage parameter configuration to explore a parameter space for a corresponding stage based one or more performance metrics achieved by one or more other stages of the EDA protocol. Further, CCC component 115 can orchestrates (e.g., manage and/or prioritize) the performance of the one or more optimization components 114 based on the one or more tuning settings 123 (e.g., based on one or more computer resource budgets defined by the one or more tuning settings 123). For example, the CCC component 115 can combine respective stage parameter configurations generated by the optimization components 114 to generate one or more flow parameter configurations to be employed by the EDA component 111 in executing the one or more EDA protocols.

In various embodiments, the tuning component 110 can employ a hierarchical structure. For example, the CCC component 115 can orchestrate parameter tuning across multi-stages of the EDA protocol, while the optimization components 114 can control corresponding stages of the EDA protocol individually. For example, the CCC component 115 can coordinate the behaviors of the optimization components 114 by adaptively allocating computation resources and/or calling for cooperation between the optimization components 114 when transitioning from one parameter targeted for tuning to another parameter.

Figure 2:
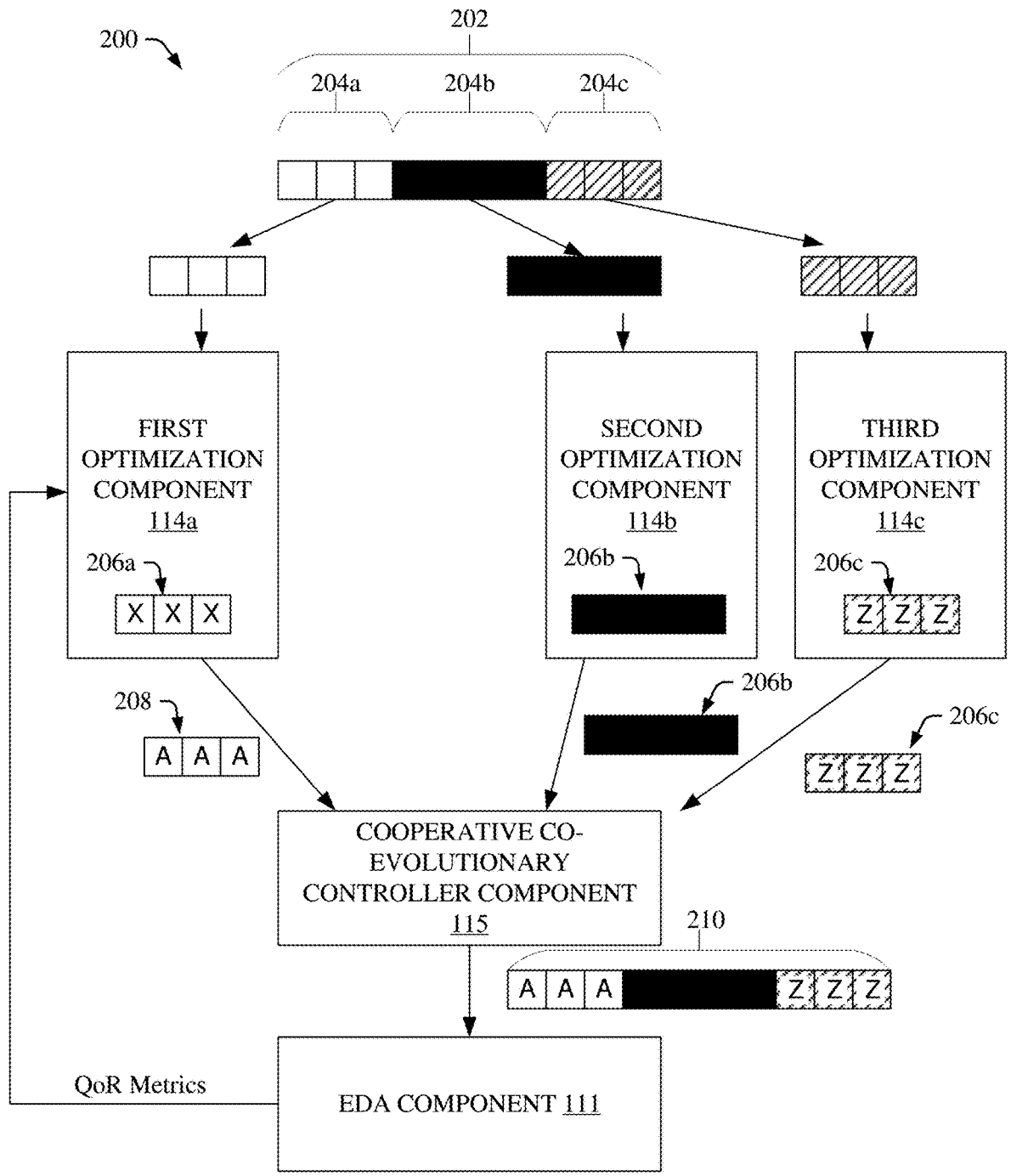
FIG. 2 illustrates a diagram of an example, non-limiting cooperative co-evolutionary optimization framework that can be employed to tune one or more parameters of a multi-stage EDA protocol in accordance with one or more embodiments described herein.

FIG. 2 illustrates a diagram of an example, non-limiting cooperative co-evolutionary optimization framework 200 that can be employed by the CCC component 115 to orchestrate the optimization components 114 in tuning one or more parameters to be employed by the EDA component 111 in accordance with one or more embodiments described herein. Repetitive description of like elements employed in other embodiments described herein is omitted for the sake of brevity. In various embodiments, the architecture of the cooperative co-evolutionary optimization framework 200 is not limited to the size and/or values depicted in FIG. 2; rather, FIG. 2 depicts an exemplary representation to illustrate one or more features of the CCC component 115 and/or optimization components 114. For instance, cooperative co-evolutionary optimization frameworks 200 involving more or less optimization components 114, additional CCC components 115, more or less stages of an EDA protocol, and/or numerical parameter values are also envisaged.

Within the cooperative co-evolutionary optimization framework 200, parameters can be tuned for each stage of an example multi-stage EDA protocol 202, where each stage 204 (e.g., first example stage 204a, second example stage 204b, and/or third example stage 204b) can be represented by blocks of respective shading and/or cross-hatching in FIG. 2. In accordance with various embodiments, the multi-stage EDA protocol 202 can be divided into multiple stages 204 based on, for example, one or more needs of a designer employing the multi-stage EDA protocol 202. In one or more embodiments, the stages 204 can be defined by the design specification 122. Example stages 204 can include, but are not limited to: logic synthesis, placement, post-placement optimization, CTS, post-CTS optimization, routing, and/or post-route optimization.

Each stage 204 can be associated with a respective optimization component 114 (e.g., first example optimization component 114a, second example optimization component 114b, and/or third example optimization component 114c). As shown in FIG. 2, each optimization component 114 can initially generate a representative stage parameter configuration 206 (e.g., first example representative stage parameter configuration 206a, second example representative stage parameter configuration 206b, and/or third example representative stage parameter configuration 206c), where the representative stage parameter configuration 206 can comprise one or more representative parameter values (e.g., one or more previously tuned parameter values, one or more default parameter values, one or more parameter values defined by the one or more input devices, and/or one or more parameter values extracted from historical knowledge data).

For a given tuning trial, the CCC component 115 can designate which stage 204 is targeted for tuning. For instance, FIG. 2 can depict an example tuning trial of the example cooperative co-evolutionary optimization framework 200 in which the first example stage 204a is targeted for tuning. As shown, the optimization component 114 associated with the targeted stage 204 (e.g., first example optimization component 114a in FIG. 2) can generate an active stage parameter configuration 208 comprising one or more parameter values not previous employed in executing the example multi-stage EDA protocol 202. Additionally, for the same tuning trial, the other optimization components 114 (e.g., second example optimization component 114b and/or third example optimization component 114c) can generate representative stage parameter configurations 206 (e.g., second representative stage parameter configuration 206b and/or third representative stage parameter configuration 206c).

The CCC component 115 can further merge the active stage parameter configuration 208 and the one or more representative stage parameter configurations 206 (e.g., second example representative stage parameter configuration 206b and/or third example representative stage parameter configuration 206c) to generate a flow parameter configuration 210. Thereby, the flow parameter configuration 210 can define one or more parameters across multiple stages 204 of the multi-stage EDA protocol 202. The CCC component 115 can share the flow parameter configuration 210 with the EDA component 111. Further, the EDA component 111 can execute the example multi-stage EDA protocol 202 with the parameter values defined by the flow parameter configuration 210. Additionally, the EDA component 111 can generate one or more QoR values characterizing the execution of the flow parameter configuration 210, which can be shared with the CCC component 115. The CCC component 115 can thereby define the stage 204 targeted for tuning during the next tuning trial. FIG. 2 depicts an example embodiment in which the first example stage 204a can be targeted again, where the QoR values can be shared with the first example optimization component 114a to generate a new active stage parameter configuration 208.

In one or more embodiments, the CCC component 115 can designate which stage is targeted for parameter tuning at a given tuning trial based on one or more computation resource budgets (e.g., set by default and/or defined via the one or more tuning settings 123). In a further example, the CCC component 115 can target a new stage 204 based on the QoR metric values achieved by the previous stage 204 being greater than or equal to a defined threshold (e.g., where the threshold can be defined via the one or more tuning settings 123). In an additional example, the CCC component 115 can designate targeted stages 204 based one or more parameter prioritizations defined by the one or more tuning settings 123. For example, the one or more input devices 106 can be employed to prioritize optimization of one or more designated stages via the one or more tuning stages.

In various embodiments, CCC component 115 can orchestrate multiple tuning trials with regards to the same stage 204. Further, the CCC component 115 can store the generated active stage parameter configurations 208 generated during the multiple tuning trials in the one or more memories 116. Further, the CCC component 115 can store the QoR metric values associated with each of the active stage parameter configurations 208 in the one or more memories 116. Once the CCC component 115 designates a new stage 204 for targeting, the optimization component 114 associated with the previously targeted stage 204 can utilize the best performing active stage parameter configuration 208 as the representative stage parameter configuration 206 in the subsequent tuning trials.

FIG. 3 illustrates a diagram of an example, non-limiting pseudo code 302 that can characterize one or more operations of the CCC component 115 in accordance with one or more embodiments described herein. Repetitive description of like elements employed in other embodiments described herein is omitted for the sake of brevity. The exemplary pseudo code 302 characterizes an example embodiment in which the optimization components 114 employ one or more ACO algorithms. Thus, pseudo code 302 represents the optimization components 114 as "ACO engines".

In various embodiments, Equation 1, presented below, can characterize a stage parameter configuration for the i-th stage 204 having $s_i$ tunable parameters. An element of $f_i$ can represent a single parameter in the stage 204.

$$f_i \in \mathbb{R}^{s_i} \qquad (1)$$

Further, Equation 2, presented below, can characterize a flow parameter configuration 210 "F" for a multi-stage EDA protocol 202 having M number of stages 204.

$$F = [f_1, f_2, \ldots, f_M] \qquad (2)$$

Also, Equation 3, presented below, can characterize a best representative parameter setting of the i-th stage 204 thus far.

$$r_i \in \mathbb{R}^{s_i} \qquad (3)$$

Moreover, in various embodiments described herein "r(*)" can characterize a reward value, which can be a weighted sum of QoR metrics of interest.

As described herein, the evaluation of a stage parameter configuration generated by an optimization component 114 can call for the cooperation of all the optimization components 114. For instance, a complete flow parameter configuration 210 can be obtained by merging the active stage parameter configuration 208 and the representative stage parameter configurations 206 (e.g., the "best-so-far" parameter configurations) associated with the remaining stages 204 not targeted by the current tuning trial. Further, the fitness of the active stage configuration 208 can be evaluated in terms of the reward (e.g., sum of QoR metric values) of the flow parameter configuration in which it participates. Thereby, the evaluation of an active stage parameter configuration 208 for one stage 204 can consider how well the parameter configuration cooperates with configurations in other stages, which coordinates the tuning for all design stages 204 to achieve the desired final QoR metric values.

For example, pseudo code 302 can characterize an exemplary performance of the CCC component 115. For instance, the cooperative co-evolutionary optimization framework 200 can contain multiple epochs, each of which consists of multiple (e.g., dozens) of tuning trials. When a tuning epoch starts, the computation resources budgeted by the CCC component 115 in the given epoch can be allocated (e.g., via the CCC component 115) to each optimization component 114 (e.g., as depicted in line 3 of pseudo code 302) based on a stage importance value (e.g., defined by the one or more tuning settings 123 and/or historic data) associated with the given stage 204, which can also reflect the potential QoR benefits brought by parameter tuning in another stage 204. As shown in FIG. 3, one stage 204 can be activated for parameter tuning in each tuning trial. The parameters for the remaining stages 204 can be set to the representative stage parameter configurations 206. Lines 7-14 of pseudo code 302 can show the process of generating a new flow parameter configuration 210, which can then be passed to the flow controller that can manage executing the given flow parameter configuration 210 via the EDA component 111 to obtain the QoR metric values regarding the entire multi-stage EDA protocol 202 (e.g., as shown in line 15 of pseudo code 302). Additionally, based on the QoR metric values, the active optimization component 114 can be updated to digest the knowledge characterized by the QoR metric values (e.g., as shown in lines 17-18 of pseudo code 302). When the stage runtime budget is exhausted, the CCC component 115 can target a new stage 204 for parameter tuning.

Once the parameter tuning of each stage 204 in one epoch is completed, the CCC component 115 can update the stage importance according to the change in QoR metric values brought by applying the parameter tuning in the given stage 204. For example, the parameter tuning of a given stage 204 can achieve greater variations in QoR metrics than the parameter tuning of another stage 204; thus, the CCC component 115 can update an importance value associated with the given stage 204 to reflect the stage's 204 greater influence on the QoR metric values. Thereby, parameter tuning of the given stage 204 can be allocated greater computation resources during subsequent epochs. In one or more embodiments, the importance value can be measured by the CCC component 115 using, for example, a fitness-based area-under-curve ("F-AUC") metric. F-AUC can be employed to assess the empirical quality of strategies by comparing the final rewards after their applications. In the cooperative co-evolutionary optimization framework 200, the strategy can correspond to the computation resource assignment to a stage 204. The F-AUC metrics can depend on relative rankings rather than the actual reward values. Hence, the F-AUC-based stage importance measure can work with various reward functions. Further, an F-AUC evaluation can be implemented without favoring stages 204 with large numbers of trials or the ones with small numbers of trials, making it suitable for stage importance evaluation in the cooperative co-evolutionary optimization framework 200. In various embodiments, the principle of stage importance-driven resource allocation (e.g., shown in line 3 of the pseudo code 302) can be to invest more computation resources to stages 204 that have higher potential reward benefits (i.e., better QoR).

In various embodiments, the one or more optimization components 114 can employ one or more optimization algorithms, such as ACO algorithms, to generate the active stage parameter configurations 208. ACO algorithms can solve optimization problems that can be reduced to finding good paths in directed optimization graphs, such as ACO graphs. The tuning component 110 can adopt ACO algorithms to solve the individual stage 204 parameter tuning. Given a design flow (e.g., defined via the one or more tuning settings 123), multiple optimization components 114 employing ACO algorithms can be initialized.

The optimization graphs (e.g., ACO graphs) can comprise a plurality of nodes. With exception to a start node (e.g., node 0), each node can correspond to one group of highly-interacting parameters. Thereby, an optimization graph (e.g., ACO graph) associated with a stage 204 having n parameter groups can contain n+1 nodes. By mapping a group of highly coupled parameters to a node (e.g., rather than mapping a single parameter to a node), the optimization component 114 can tune heavily-interacting parameters as a whole. Further, the optimization graphs (e.g., ACO graphs) can comprise a plurality of edges. For the node i corresponding to the i-th parameter group with m feasible configurations, there exists m directed edges connecting from node i−1 to node i. Each edge can correspond to a stage parameter configuration (e.g., an active stage parameter configuration 208 and/or a representative stage parameter configuration 206) for parameter group i. The optimization components 114 can define one or more paths traversing the optimization graphs (e.g., ACO graphs). Each path from the start node to the last node goes through all nodes exactly one time, choosing an incoming edge for each node. Thereby, each such path can correspond to a complete flow parameter configuration 210 of the corresponding stage 204.

Figure 4:
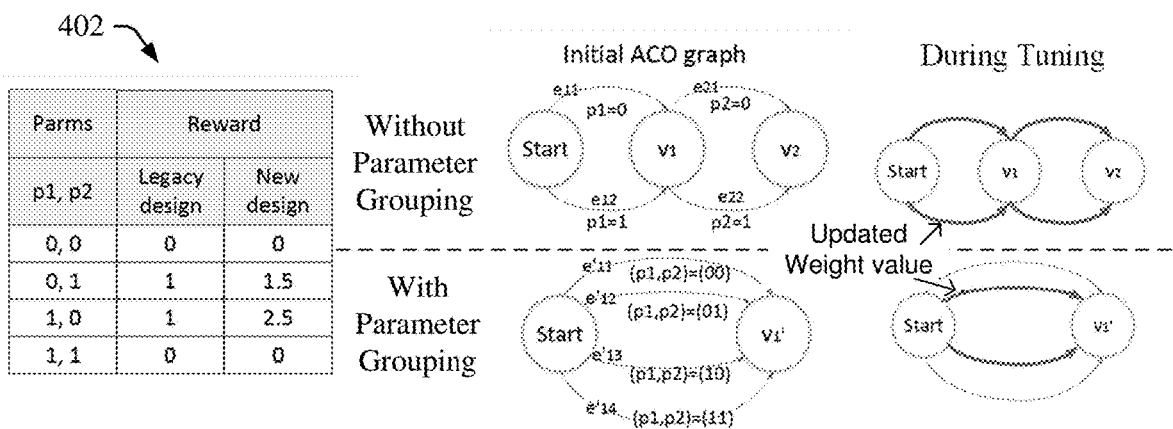
FIG. 4 illustrates a diagram of example, non-limiting optimization graph initialization that can be utilized by one or more optimization components in tuning the parameters of one or more a multi-stage EDA protocols in accordance with one or more embodiments described herein.

FIG. 4 illustrates a diagram of example, non-limiting ACO graph initialization that can be employed by the one or more optimization components 114 in accordance with one or more embodiments described herein. Repetitive description of like elements employed in other embodiments described herein is omitted for the sake of brevity. Table 402 can include example parameter configurations regarding a stage 204 having two parameters "p1," and "p2". Table 402 further includes the resulting rewards (e.g., QoR metric evaluations) associated with the parameter configurations with regards to a historic execution of the EDA protocol (e.g., represented by "legacy design") and a new execution of the EDA protocol (e.g., represented by "new design"). As shown in FIG. 4 nodes can be represented by circles, and edges can be represented by arrows connected between nodes.

In various embodiments, the one or more optimization components 114 can employ the one or more optimization algorithms (e.g., ACO algorithms) with one or more parameter grouping operations or without one or more parameter grouping operations. Without parameter grouping, each node of the optimization graph (e.g., ACO graph) can be associated with a single parameter, and each edge can be associated with a single parameter value; where a path between multiple nodes (e.g., connecting multiple edges) can be associated with a parameter configuration. With parameter grouping, a single node of the optimization graph (e.g., ACO graph) can be associated with multiple parameters (e.g., a parameter group), and each edge can be associated with a parameter configuration; where multiple edges can exist between respective nodes.

For instance, node v' can correspond to parameter group (p1, p2), and edges e'11 through e'14 can represent the possible parameter configurations of the parameter group (e.g., e'11 can represent the parameter configuration characterized by (p1, p2)=(0, 0)). For each edge $e_{ij}$, the j-th incoming edge for node i, can be associated with a weight value, denoted by $\tau_{ij}$. The weight value of an edge can indicate the fitness of the corresponding parameter configuration for a parameter group. In generating a new active stage parameter configuration 208 for the corresponding stage 204 (e.g., as delineated in line 9 of pseudo code 302), the optimization component 114 can identify a path from the start node to the last node in the ACO graph (e.g., where the new parameter configuration is defined by the path through the ACO graph). In various embodiments, the optimization component 114 can choose the path by selecting edges with a probability proportional to the weight value (e.g., the higher the weight value of an edge, the higher probability the edge will be selected by the optimization component 114 as part of the path).

When the reward (e.g., a sum of QoR metric values) is obtained for a given path, the weight values of all edges can be updated in a positive-feedback manner (e.g., in accordance with line 19 of pseudo code 302), as characterized by Equation 5 below.

$$\tau_{ij} = (1-\rho)\tau_{ij} + l(i,j)\varepsilon \quad (5)$$

Where $\rho \in [0,1]$ can be the evaporation ratio, "l(i, j)" can indicate whether the edge $e_{ij}$ participates in the path (e.g., having a value of 1 if $e_{ij}$ belongs to the path and a value of 0 otherwise), and $\varepsilon$ can be proportional to the reward of the path. In various embodiments, the weight values of edges participating in a path associated with a positive reward (e.g., a desirable QoR metric) can be increased when updating the optimization graph (e.g., ACO graph) between tuning trials. In turn, these updated edges, corresponding to specific configurations of parameter groups, can be more likely to be chosen in future trials since the weight values are higher.

In various embodiments, the one or more optimization components 114 can employ other optimization algorithms in addition to, or alternative to, the one or more ACO algorithms described herein. Additionally, the one or more optimization components 114 can employ different optimization algorithms when tuning different stages 204. Example alternative optimization algorithms can include, but are not limited to: a genetic algorithm, a random search algorithm, a Bayesian optimization algorithm, a combination thereof, and/or the like.

Figure 5:
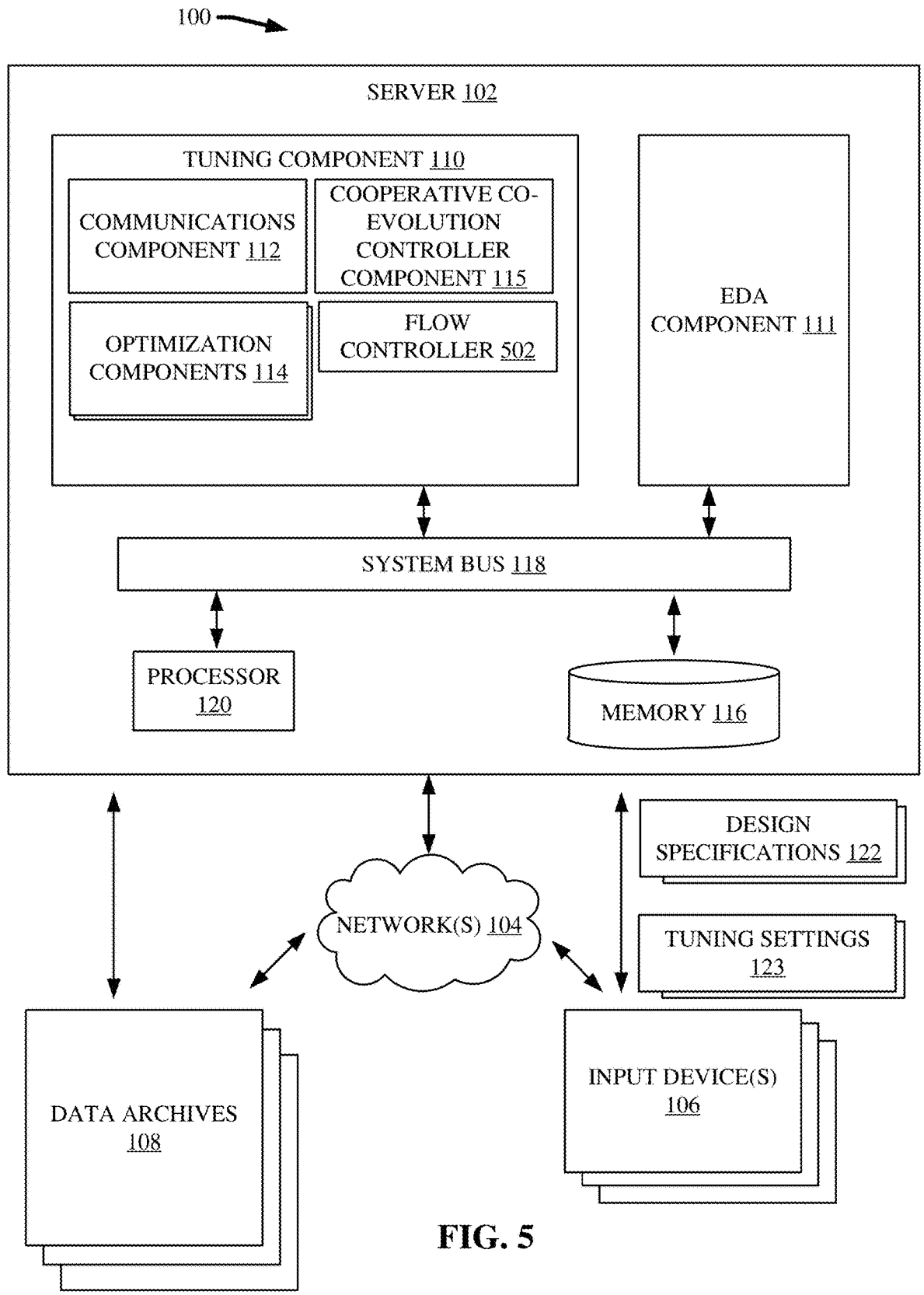
FIG. 5 illustrates a block diagram of an example, non-limiting system that can deploy one or more jump-start and/or early-stop techniques to reduce runtime of one or more EDA protocols in accordance with one or more embodiments described herein.

FIG. 5 illustrates a diagram of the example, non-limiting tuning component 110 further comprising flow controller component 502 in accordance with one or more embodiments described herein. Repetitive description of like elements employed in other embodiments described herein is omitted for the sake of brevity. In various embodiments, the flow controller component 502 can launch a manage a new execution of the EDA protocol by the EDA component 111 for each flow parameter configuration 210 generated by the CCC component 115. For example, the flow controller component 502 can enhance computation resource management associated with the parameter tuning and EDA protocol execution by exploiting one or more jump-start techniques and/or early stop techniques. By employing one or more jump-start techniques, the flow controller component 502 can leverage historical data (e.g., from the one or more data archives 108) to identify one or more parameter configurations that can be utilized for one or more stages 204 of the multi-stage EDA protocol 202; thereby, freeing the CCC component 115 to re-allocate computation resources to the parameter tuning of other stages 204.

FIG. 6 illustrates a diagram of an example, non-limiting pseudo code 602 that can be employed by the flow controller component 502 to perform one or more jump-start techniques in accordance with one or more embodiments described herein. Repetitive description of like elements employed in other embodiments described herein is omitted for the sake of brevity. In various embodiments, parameter configurations and/or design outcomes (e.g., QoR metric values) of previous tuning trials can be stored in the one or more memories 116 and can be accessible by the flow controller component 502. For a new flow parameter configuration 210 "F", the flow controller component 502 can first query the one or more memories 116 to determine if there exists a previous flow parameter configuration F' and a constant $k \in (1, M]$ that satisfies $f_i = f_i'$ for all $i \in [1, k-1]$. If so, flow controller component 502 can determine the maximum value for k, denoted as k*.

Further, the flow controller component 502 can retrieve the intermediate result (e.g., a stage parameter configuration and/or associate QoR metric values) of the k*−1-th stage for F' can be fetched, and the cooperative co-evolutionary optimization framework 200 can starting parameter tuning trials from the k*-th stage 204 (e.g., where the intermediate result can be used as the one or more representative stage parameter configurations 206 for the one or more stages 204 prior to the k*-th stage 204). The jump-start rate can be defined as the ratio of the number of times where an achieved parameter configuration is retrieved and used as an intermediate result to the number of total tuning trials. The stage-by-stage tuning behavior orchestrated by the CCC component 115 in each epoch can produce higher jump-start rates as stages 204 proceed with more tuning trials.

In various embodiments, the flow controller component 502 can further employ one or more early-stop techniques to terminate execution of the multi-stage EDA protocol 202 and/or the cooperative co-evolutionary optimization framework 200 prior to a scheduled termination (e.g., prior to parameter tuning of each stage 204 of the multi-stage EDA protocol 200). In one more embodiments, the flow controller component 502 can utilize a branch-and-bound strategy to facilitate execution of the one or more early-stop techniques.

For example, the EDA component 111 can send intermediate results (e.g., comprising one or more employed stage parameter configurations and/or associate QoR metric values) to the flow controller component 502 at the completion of each stage 204. Further, the EDA component 111 can query the flow controller component 502 between stages 204 to determine whether to proceed to the next stage 204. A stage parameter configuration $[f_1, \ldots, f_k]$ ($k \in [1, M]$) can be analogous to a branch in a decision tree. At each stage 204, the flow controller component 502 can estimate a probabilistic upper bound of final reward of the branch and can compare it with the current best reward (e.g., sum of QoR metrics). If the upper bound is inferior, the thread is terminated. Otherwise, it proceeds to the next stage 204. In various embodiments, the CCC component 115 can assign no computation resources to the terminated branches in the subsequent tuning trials. The reward upper bound estimation can be made by the flow controller component 502 by summing up the upper bounds of individual QoR metrics of interest. Ignoring the dependencies among metrics tends to increase the "safety" of the estimated upper bounds, due to a difficulty associated with improving all of the QoR metrics simultaneously.

Figure 7A:
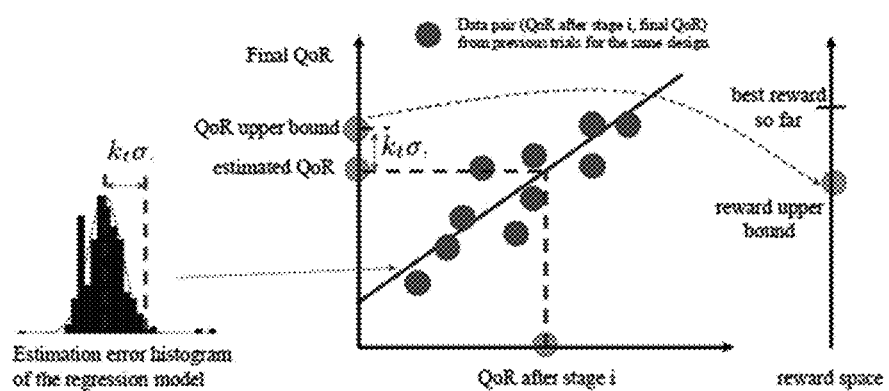
FIGS. 7A-7E illustrate diagrams of example, non-limiting graphs that can depict worst negative slack ("WNS") correlations between different design stages to facilitate one or more upper bound estimations employed in one or more early-stop techniques in accordance with one or more embodiments described herein.

FIGS. 7A-7E illustrate diagrams of an example, non-limiting upper bound estimation technique 702 that can be employed by the flow controller component 502 to facilitate executing one or more early-stop techniques in accordance with one or more embodiments described herein. Repetitive description of like elements employed in other embodiments described herein is omitted for the sake of brevity. As shown in FIG. 7A, an estimate of the final QoR can be obtained by a linear regression model using the intermediate QoR as input, which can capture the correlation between different stages.

Figure 7B:
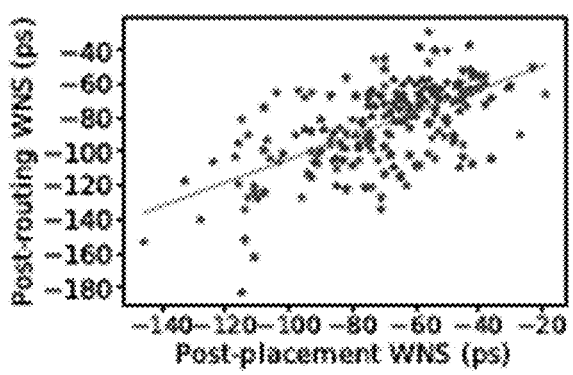
Figure 7C:
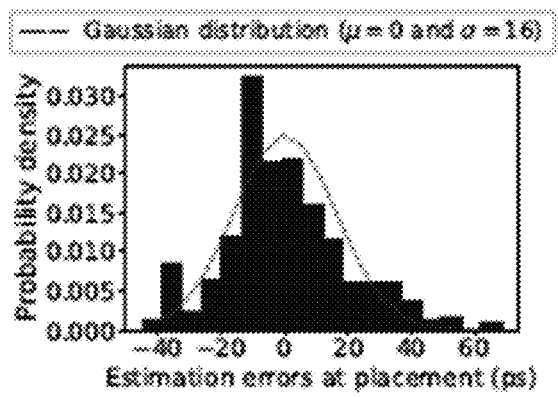
Figure 7D:
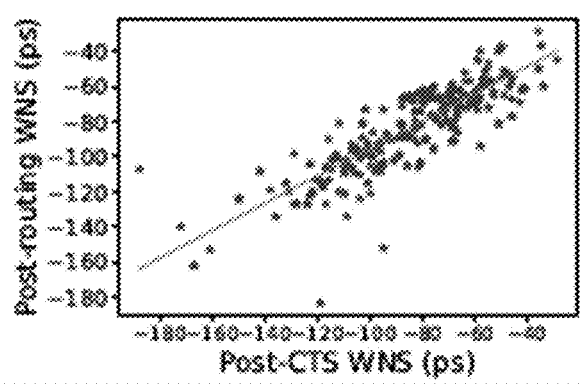
Figure 7E:
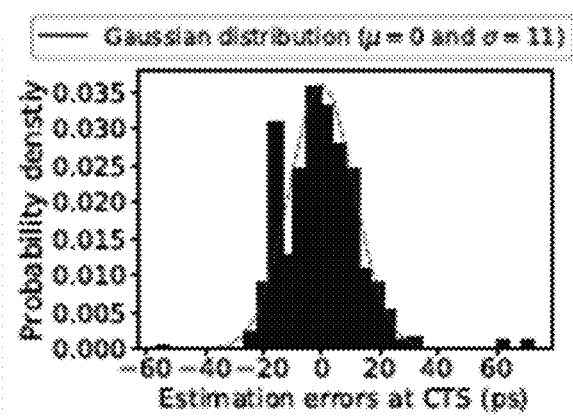

The upper bound estimation can be obtained by adding a guard band to the estimated final QoR metric values. As shown in FIGS. 7B-7E, the error margins of the linear regression model can diminish as stages 204 progress. For example, the prediction of final QoR at a later stage 204 can be more accurate than the prediction at an earlier stage 204. The guard band can be adaptive to the prediction errors at different stages 204. FIGS. 7B-7E illustrate that the prediction errors of linear regression models can be described by a zero-mean Gaussian distribution. For instance, FIGS. 7B-7E can depict worst negative slack correlations between different stages 204. FIG. 7B can regard an exemplary post-placement and post-route stage 204; FIG. 7C can depict an estimation error histogram of a linear model at an exemplary placement stage 204. FIG. 7D can regard an exemplary post-CTS and post-route stage 204. FIG. 7E can depict an error histogram at CTS. With the Gaussian model of prediction errors, the flow controller component 502 can determine the guard band based on properties of Gaussian distribution. For instance, the guard band can be set to be $k_t\sigma$, where $\sigma$ can be the standard deviation of the prediction errors and $k_t$ can be a hyper-parameter controlling the tradeoff between QoR results and parameter tuning runtime. The smaller the $k_t$ value is, the more likely a branch is pruned to reduce runtime at risk of missing desirable parameter configurations.

For each QoR metric value and each stage 204, the flow controller component 502 can employ an upper bound estimation approach that has three learnable parameters: (1) a slope parameter; (2) an off-set of the linear regression model; and/or (3) a standard deviation of the zero-mean Gaussian prediction errors. Data from previous tuning trials for the same design can be used to learn these parameters. In various embodiments, the flow controller component 502 can achieve an effective reward upper bound estimation by monitoring the prediction errors and/or adding an adaptive guard band to the prediction results. In one or more embodiments, the linear regression model can be replaced by other more advanced models that can provide tighter bounds, thereby further boosting the efficiency of the early-stop technique.

Figure 8:
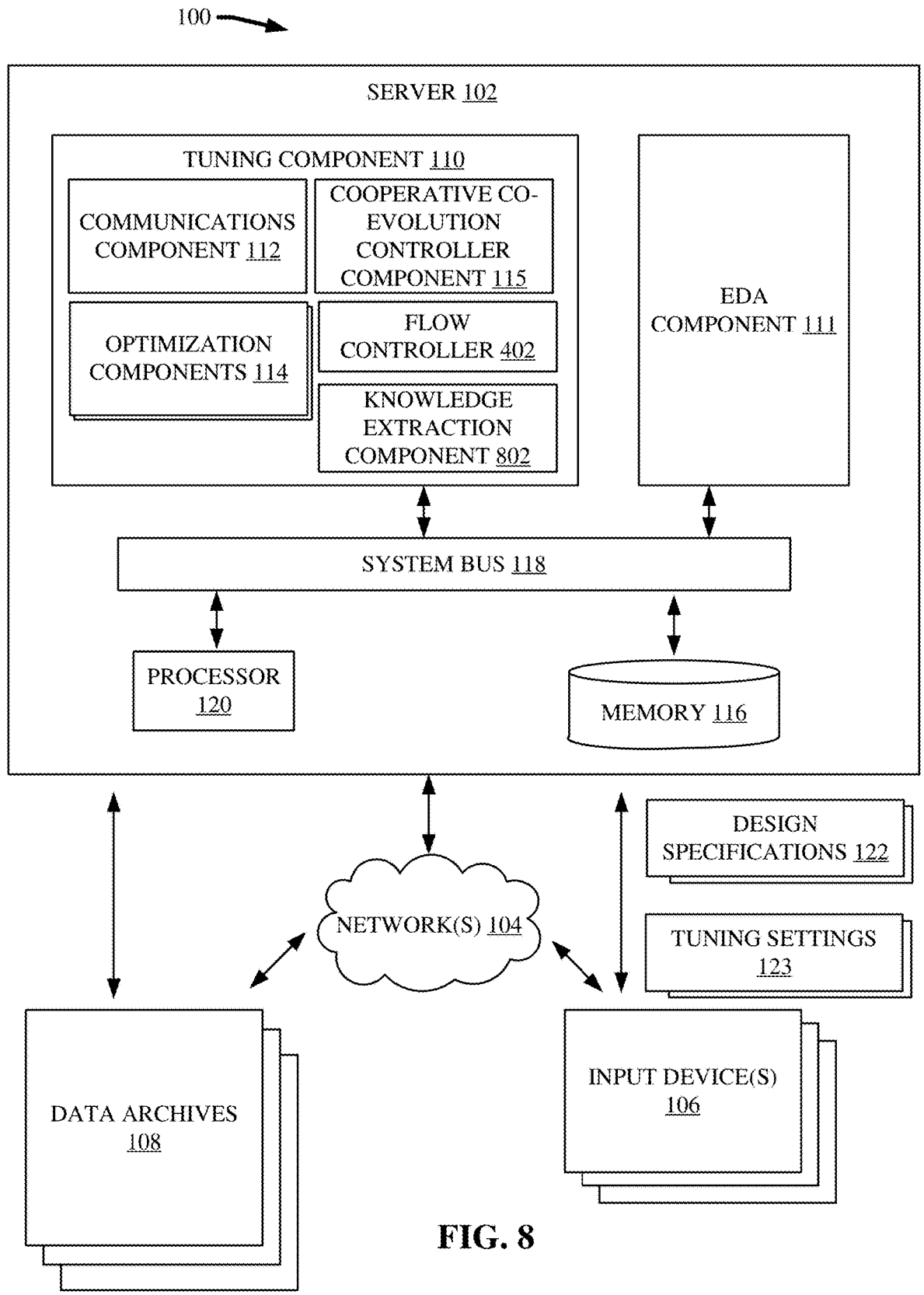
FIG. 8 illustrates a diagram of an example, non-limiting system that can utilize parameter knowledge derived from archival data to facilitate tuning one or more EDA parameters in accordance with one or more embodiments described herein.

FIG. 8 illustrates a diagram of the example, non-limiting tuning component 110 further comprising knowledge extraction component 802 in accordance with one or more embodiments described herein. In various embodiments, the knowledge extraction component 802 can extract parameter knowledge from historic data of the one or more data archives 108, where the parameter knowledge can facilitate: the CCC component 115 determining stage importance values; and/or the one or more optimization components 114 determine weight values for the one or more optimization graphs (e.g., ACO graphs).

For example, the stage importance update performed by the CCC component 115 and/or the weight value update for the one or more optimization graphs (e.g., ACO graphs) can be based on the impact of parameters on designs generated by the EDA protocol for better resource utilization and/or efficient searching in the parameter configuration space. The tuning component 110 can accelerate identification of the parameter effects by extracting knowledge from previous historic data regarding one or more EDA protocols and transferring the knowledge to application of the parameter tuning of a new execution of the one or more EDA protocols. Further, the transferred knowledge can guide the selection of parameters to be tuned and construction of ACO graphs, to narrow down the search space and enhance weight value update efficiency.

In various embodiments, the knowledge extraction component 802 can extract general knowledge that is applicable to a wide range of designs by aggregating the parameter knowledge extracted from a set of legacy designs. Further, different parameters can have different degrees of impact on the final QoR metric values of a design. For effective parameter tuning, parameters having large positive impact on QoR metric values can be explored more extensively (e.g., via the allocation of additional computation resources and/or additional tuning trials defined by the CCC component 115). To quantitatively measure such importance of individual parameters, parameter importance can be characterized via the following equations. Given a parameter f whose baseline setting is $\bar{f}$, the reward improvement "$r_{imp}$" can be evaluated in accordance with Equation 6 below.

$$r_{imp}(f)=\max\{0, r(\ldots, f, \ldots)-\bar{r}\} \quad (6)$$

Where r(*) can be the reward function, and r can be the baseline reward obtained by using the baseline settings for all parameters. The parameter importance of f (e.g., denoted by IM(f) can be characterized by Equation 7 below.

$$IM(f) = \max_{\Delta f} r_{imp}(\ldots, \bar{f}+\Delta f, \ldots) - r_{imp}(\ldots, \bar{f}, \ldots), \quad (7)$$

Where $\Delta f$ can be a perturbation on parameter f. In various embodiments, when measuring the importance for one parameter, knowledge extraction component 802 can vary the settings for the remaining parameters and obtain the maximal IM value. Further, in one or more embodiments, the stage importance determined by the CCC component 115 cane an extension of the parameter importance.

In various embodiments, the likelihood for a parameter configuration to produce higher QoRs can be inferred by analyzing the archives of legacy designs. For example, the knowledge extraction component 802 can actively biases the stage parameter configuration generation performed by the optimization components 114 by initializing weight values of one or more optimization graphs (e.g., ACO graphs, as exemplified in FIG. 4) using parameter configuration and final QoR pairs from the legacy data samples stored in the one or more data archives 108. Legacy data samples included in the one or more data archives 108 can correspond to one or more parameter configurations that are different from the baseline parameter configuration for at least one stage 204.

Some parameters can have strong interactions with each other in affecting the QoR metric values of the final design. In various embodiments, the tuning component 110 can capture such parameter interactions by detecting a violation of the monotonicity condition. For example, the tuning component 110 (e.g., via the knowledge extraction component 802) can employ the following Equations 8-10, given a stage parameter configuration $f_k$ for stage 204 $k$ and the stage's 204 two parameters $f_i^k$ and $f_j^k$:

$$\Delta_i^k = r(\ldots, f_i^k + \Delta f_i^k, \ldots) - r(\ldots, f_i^k, \ldots) \quad (8)$$

$$\Delta_j^k = r(\ldots, f_j^k + \Delta f_j^k, \ldots) - r(\ldots, f_j^k, \ldots) \quad (9)$$

$$\Delta_{i,j}^k = r(\ldots, f_i^k + \Delta f_i^k, \ldots, f_j^k + \Delta f_j^k, \ldots) - r(\ldots, f_i^k, \ldots, f_j^k, \ldots) \quad (10)$$

Where $\Delta_i^k$, $\Delta_j^k$, and $\Delta_{i,j}^k$ can be changes in a reward function r(*) caused by perturbation of the $f_i^k$ and/or $f_j^k$. For $\Delta_i^k > 0$ and $\Delta_j^k > 0$, the monotonicity of the two parameters can hold if, and only if, $\Delta_{i,j}^k > \Delta_i^k$ and $\Delta_{i,j}^k > \Delta_j^k$.

If the monotonicity condition does not hold, the degree of interaction between the two parameters ("$\theta_{i,j}^k$") can be estimated by the knowledge extraction component 802 in accordance with Equation 11 below.

$$\theta_{i,j}^k = \max\{\Delta_i^k - \Delta_{i,j}^k, \Delta_j^k - \Delta_{i,j}^k, 0\} \quad (11)$$

By employing the one or more data archives 108, the knowledge extraction component 802 can calculate the degree of interaction for each pair of parameters within a given stage 204, and/or rank the pairs based on the interaction value. Further, the knowledge extraction component 802 can consolidate top-ranking pairs into one or more parameter groups, which can be utilized by the one or more optimization components 114 to update the one or more optimization graphs (e.g., ACO graphs, as exemplified in FIG. 4).

In accordance with the various embodiments described here, the knowledge extraction component 802 can utilize the historic data of the one or more data archives 108 to initialize the CCC component 115 and/or the optimization components 114. For example, the tuning settings 123 can define a set of candidate tuning parameters. The knowledge extraction component 802 can calculate the parameter importance associated with the candidate tuning parameters based on the historic data (e.g., legacy design data) stored in the one or more data archives 108 in accordance with, for example, Equations 6-7. Thereby, the CCC component 115 can allocate resources to the optimization components 114 during the tuning trials based on the calculated parameter importance value (e.g., where parameters with greater importance values can be allocated more computation resources than parameters with lower importance values).

In another example, the knowledge extraction component 802 can facilitate the optimization components 114 in grouping parameters to update the one or more optimization graphs (e.g., ACO graphs). For parameters in a given stage 204, the knowledge extraction component 802 can compute pair-wise parameter interactions in accordance with, for example, Equations 8-11. Thereby, the optimization components 114, and/or the knowledge extraction component 802, can group parameters having high interaction values together into a parameter group that can correspond to a single node in the one or more optimization graphs (e.g., ACO graphs). For instance, FIG. 4 exemplifies how parameter grouping can enhance weight value efficiency in the optimization graphs (e.g., ACO graphs).

In a further example, the CCC component 115 can calculate the stage importance values based on the historic data extracted from the one or more data archives 108 via the knowledge extraction component 802. For instance, the CCC component 115 can utilize the stage importance value calculated from the historic data to initialize the stage importance vector $\omega_0$ in, for example, pseudo code 302 to enhance computation resource utilization. In an additional example, the historic data from the one or more data archives 108 can be utilized to initialize the weight values of the one or more optimization graphs (e.g., ACO graphs). For instance, the weight values can be initialized using parameter configurations and/or QoR values from previously generated designs stored in the one or more data archives 108.

In in accordance with various embodiments, FIG. 4 can exemplify parameter grouping and/or weight value initialization that can be facilitated by the knowledge extraction component 802. For instance, table 402 includes two parameters (e.g., p1, p2) that strongly interact with each other. Further, with regards to parameters p1 and p2, a new design shows similar parameter bias to a legacy design stored it the one or more data archives 108. The highly interactive parameters can be combined into a single parameter group, which can correspond to a single node (e.g., V1') in the ACO graph. When initializing the one or more optimization components 114, the weight values for the edges of the optimization graph (e.g., the ACO graph) can be updated based on the historic rewards previously observed with the parameter settings on the legacy design. FIG. 4 shows an example embodiment that utilizes parameter grouping and an example embodiment that does not utilize parameter grouping. As shown in FIG. 4, without the parameter grouping, the low-reward setting (0; 0) and (1; 1) can have weighted values (e.g., as exemplified by the bold edges) and thereby be likely to be visited during the subsequent parameter search. Also shown in FIG. 4, with the parameter grouping, the same parameter configurations (e.g., paths through the optimization graph) can have lower weight values (e.g., as exemplified by the non-bold edges). Hence, the high-reward parameter configurations (e.g., (0,1) and/or (1,0) in FIG. 4) can be more likely to be generated by the optimization component 114 than the low reward settings. As such, the parameter configuration generation and/or search process via the cooperative co-evolutionary framework 200 can be rendered more efficient, leading to a better solution within given runtime budget.

Figure 9:
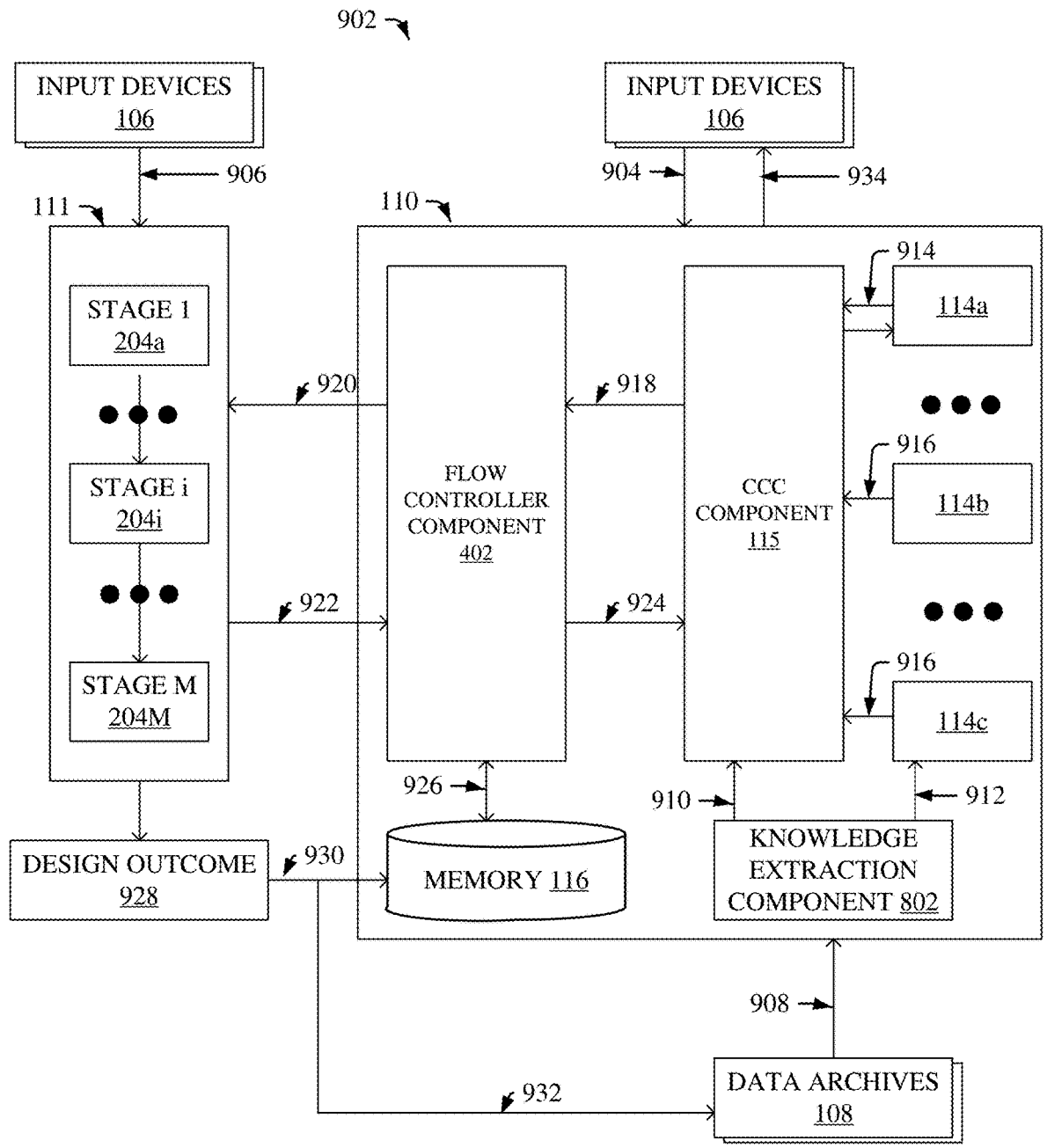
FIG. 9 illustrates a diagram of example, non-limiting system communication scheme that can facilitate tuning one or more parameters of a multi-stage EDA protocol in accordance with one or more embodiments described herein.

FIG. 9 illustrates a diagram of the example non-limiting communication scheme 902 that can be executed by the system 100 in accordance with one or more embodiments described herein. Repetitive description of like elements employed in other embodiments described herein is omitted for the sake of brevity.

At 904, the one or more input devices 106 can share the tuning settings 123 with the tuning component 110. In accordance with various embodiments described herein, the tuning settings 123 can delineate target parameters, computation resource budgets, stage and/or parameter prioritizations, and/or QoR prioritizations to guide the computation resource allocation performed by the CCC component 115 during the tuning trials. Also, the one or more input devices 106 can be employed to share the design specification 122 with the EDA component 111 at 906. In accordance with various embodiments described herein, the design specification 122 can delineate the stages 204 of a multi-stage EDA protocol and/or associate parameter settings to generate a target design.

At 908, the knowledge extraction component 802 can extract historic data from the one or more data archives 108 to perform one or more knowledge transfers to initialize and/or enhance the functions of the CCC component 115 and/or optimization components 114. For example, in accordance with various embodiments described herein, the knowledge extraction component 802 can transfer knowledge regarding parameter importance and/or stage importance calculated based on historic data of previously executions of the multi-stage EDA protocol 200, and/or similar EDA protocols, to the CCC component 115 at 910. In another example, in accordance with various embodiments described herein, the knowledge extraction component 802 can transfer knowledge regarding parameter interactions and/or historic weight values with the optimizations components 114 at 912 to initialize and/or update one or more optimization graphs (e.g., ACO graphs).

At 914, one or more of the optimization components 114 (e.g., first example optimization component 114a) can generate an active stage parameter configuration 208, and/or share the active stage parameter configuration 208 with the CCC component 115 in accordance with various embodiments described herein. At 916, one or more of the optimization components 114 (e.g., second example optimization component 114b and/or third example optimization component 114c) can generate one or more representative stage parameter configurations 206, and/or share the one or more representative stage parameter configurations 206 with the CCC component 115 in accordance with various embodiments described herein. At 918, the CCC component 115 can merge the stage parameter configurations to generate a flow parameter configuration 210, and share the flow parameter configuration 210 with the flow controller component 502.

At 920, the flow controller component 502 can share the flow parameter configuration 210, data regarding one or more jump-start techniques, and/or data regarding one or more early-stop techniques with the EDA component 111. The EDA component 111 can execute the multi-stage EDA protocol 202 in accordance with the design specification 122 with the flow parameter configuration 210 and return one or more QoR metric values to the flow controller component 502 at 922. For example, the EDA component 111 can return one or more intermediate QoR metric results with the flow controller component 502 between stages 204. Additionally, the flow controller component 502 can share the one or more intermediate QoR metrics with the CCC component 115 to facilitate one or more computation resource allocation determinations for subsequent tuning trials. As shown in FIG. 9, the flow controller component 502 can also store one or more flow parameter configurations, stage parameter configurations, and/or associate QoR metrics (e.g., in the one or more memories 116) at 926. Further, by completing the multi-stage EDA protocol 202, the EDA component 111 can generate a final design 928, which can further be storied in the one or more memories 116 at 930 and/or in the one or more data archives 108 at 932 (e.g., along with associate parameter configurations and/or QoR metric values). Additionally, the final design 928 and/or associate flow parameter configuration 210 and/or QoR metric values can be shared with the one or more input devices 106 at 934.

FIGS. 10-11 illustrate example, non-limiting tables characterizing one or more experiments performed to demonstrate the efficacy of the system 100 in accordance with one or more embodiments described herein. Repetitive description of like elements employed in other embodiments described herein is omitted for the sake of brevity. Various experiments were conducted on sixteen IWLS 2005 benchmark designs, whose characteristics are shown in Table 1000 of FIG. 10. A total of 21 discrete parameters were tuned with a search space as large as 244,8880,128. Information about the parameters is shown in Table 1002 of FIG. 10.

To evaluate the efficiency and the effectiveness of the tuning component 110, the following parameter tuning methods were performed and compared: Baseline tuning ("Baseline"), which can comprise setting a highest-effort parameter configuration suggested by a tool manual associated with the EDA protocol (e.g., as exemplified in Table 1002); Bayesian optimization ("BO"); a recommender system ("Recommender"), which can comprise training a latent factor model using a matrix optimization algorithm; a parameter importance sampling approach ("FIST"), parameter tuning via the tuning component 110 utilizing knowledge transfer facilitated by the knowledge extraction component 802, and parameter tuning via the tuning component 110 without knowledge transfer.

Table 1102 of FIG. 11 can show the total negative slack ("TNS"), worst negative slack ("WNS"), and power reductions that can be obtained after tuning parameters with the associate techniques. As shown in table 1102, the tuning component 110 can achieve an 11% higher average TNS reduction, a 25.7% higher average WNS reduction, and a 19% higher average power reduction that the comparison methods. In various embodiments, the knowledge transfer techniques and/or cooperative co-evolutionary framework 200 described herein can attribute to the superior performance metrics demonstrated in table 1102. The superior performance of the tuning component 110 comes from both our knowledge transfer techniques and effective exploration with the CC framework.

FIG. 12 illustrates a flow diagram of an example, non-limiting computer-implemented method 1200 that can facilitate tuning one or more parameter configurations for a multi-stage EDA protocol via a cooperate co-evolutionary optimization framework 200 in accordance with one or more embodiments described herein. Repetitive description of like elements employed in other embodiments described herein is omitted for the sake of brevity.

At 1202, the computer-implemented method 1200 can comprise extracting (e.g., via knowledge extraction component 802), by a system 100 operatively coupled to a processor 120, parameter knowledge from archival data. In various embodiments, the parameter knowledge can regard one or more candidate parameters designated by tuning settings 123 regarding one or more multi-stage EDA protocols 202. Additionally, the archival data can be retrieved from one or more data archives 108. In accordance with various embodiments described herein, the parameter knowledge can characterize, for example: parameter importance (e.g., associated with a degree of impact a given parameter can have on a QoR metric regarding execution of the multi-stage EDA protocol 202), parameter bias (e.g., likelihood to produce higher QoR metric values), parameter interaction (e.g., characterizing how parameters can interact with each other), and/or stage importance.

At 1204, the computer-implemented method 1200 can comprise generating (e.g., via CCC component 115), by the system 100, a priority ranking for the multiple stages 204 of the multi-stage EDA protocol 202. For example, the ranking at 1204 can be based on the parameter knowledge extracted at 1202, one or more QoR prioritizations defined by the tuning settings 123, and/or one or more stage prioritization preferences defined by the tuning settings 123. At 1206, the computer-implemented method 1200 can comprise coordinating (e.g., via the CCC component 115), by the system 100, a transfer of the parameter knowledge between a plurality of optimization engines (e.g., optimization components 114). For instance, each optimization engine (e.g., optimization component 114) can be assigned to an associate stage 204 of the multi-stage EDA protocol 202, and thereby to one or more associate parameters.

At 1208, the computer-implemented method 1200 can comprise initializing (e.g., via the knowledge extraction component 802 and/or the optimization components 114), by the system, weight values for a plurality of optimization graphs. For example, the weight values can be initialized based on the parameter knowledge extracted at 1202. Further, the plurality of optimization graphs can be updated based on one or more parameter groupings based on one or more parameter interactions defined by the parameter knowledge extracted at 1202. In various embodiments, the plurality of optimization graphs can be ACO graphs (e.g., as exemplified in FIG. 4). At 1210, the computer-implemented method 1200 can comprise adaptively allocating (e.g., via the CCC component 115), by the system 100, computation resources to the multiple stages 204. For example, computation resources can be allocated to the stages 204 based on, for instance, a resource budget (e.g., defined via the one or more tuning settings 123) and/or a stage importance value (e.g., which can be a based on the extract parameter knowledge).

At 1212, the computer-implemented method can comprise employing (e.g., via optimization components 114), by the system 100, one or more optimization algorithms to generate a first parameter configuration for a first stage of the multi-stage EDA protocol 202 based on the optimization graph initialized at 1208. For example, an optimization component 114 employ an ACO algorithm to generate an active stage parameter configuration 208 for an associate stage 204 targeting for tuning during the given tuning trial. At 1214, the computer-implemented method 1200 can comprise generating (e.g., via CCC component 115), by the system 100, a flow parameter configuration 210 for the multi-stage EDA protocol 202. For example, the flow parameter configuration 210 can merge the first parameter configuration generated at 1212 and a second parameter configuration for a second stage 204.

In accordance with various embodiments described herein, the cooperative co-evolutionary optimization framework 200 facilitated by steps 1202-1214 of the computer-implemented method 1200 can be repeated over multiple tuning trials to explore a parameter space associated with the multi-stage EDA protocol. Further, the cooperative co-evolutionary optimization framework 200 can employ one or more jump-start or early-stop techniques (e.g., via the flow controller component 502) to selectively tune targeted stages 204 of the multi-stage EDA protocol 202 in accordance with various embodiments described herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 13:
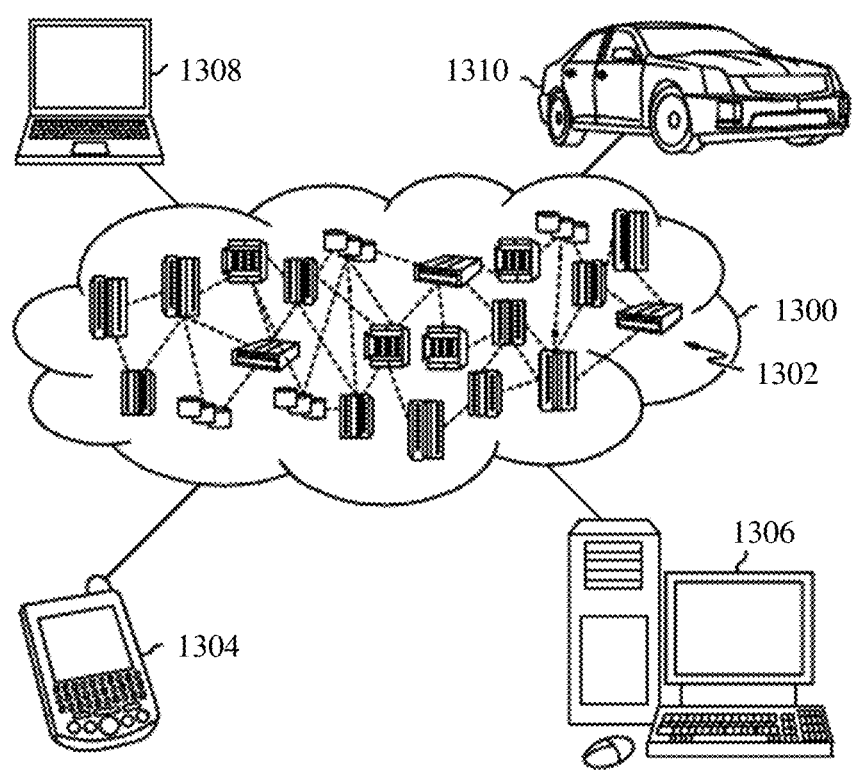
FIG. 13 depicts a cloud computing environment in accordance with one or more embodiments described herein.

Referring now to FIG. 13, illustrative cloud computing environment 1300 is depicted. As shown, cloud computing environment 1300 includes one or more cloud computing nodes 1302 with which local computing devices used by cloud consumers, such as, for example, personal digital assistant (PDA) or cellular telephone 1304, desktop computer 1306, laptop computer 1308, and/or automobile computer system 1310 may communicate. Nodes 1302 may communicate with one another. They may be grouped (not shown) physically or virtually, in one or more networks, such as Private, Community, Public, or Hybrid clouds as described hereinabove, or a combination thereof. This allows cloud computing environment 1300 to offer infrastructure, platforms and/or software as services for which a cloud consumer does not need to maintain resources on a local computing device. It is understood that the types of computing devices 1304-1310 shown in FIG. 13 are intended to be illustrative only and that computing nodes 1302 and cloud computing environment 1300 can communicate with any type of computerized device over any type of network and/or network addressable connection (e.g., using a web browser).

Figure 14:
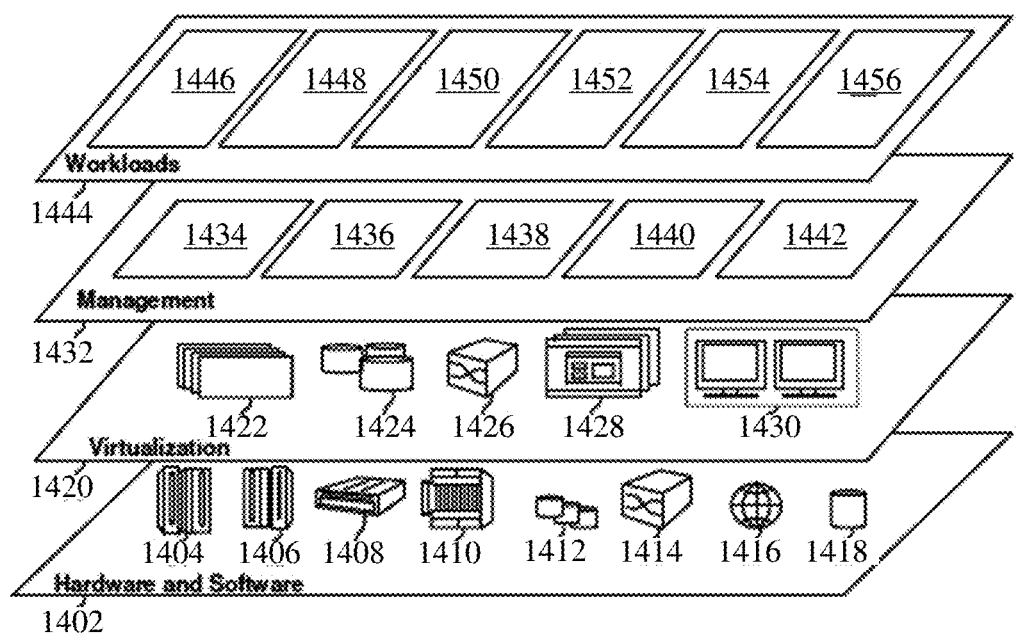
FIG. 14 depicts abstraction model layers in accordance with one or more embodiments described herein.

Referring now to FIG. 14, a set of functional abstraction layers provided by cloud computing environment 1300 (FIG. 13) is shown. Repetitive description of like elements employed in other embodiments described herein is omitted for the sake of brevity. It should be understood in advance that the components, layers, and functions shown in FIG. 14 are intended to be illustrative only and embodiments of the invention are not limited thereto. As depicted, the following layers and corresponding functions are provided.

Hardware and software layer 1402 includes hardware and software components. Examples of hardware components include: mainframes 1404; RISC (Reduced Instruction Set Computer) architecture based servers 1406; servers 1408; blade servers 1410; storage devices 1412; and networks and networking components 1414. In some embodiments, software components include network application server software 1416 and database software 1418.

Virtualization layer 1420 provides an abstraction layer from which the following examples of virtual entities may be provided: virtual servers 1422; virtual storage 1424; virtual networks 1426, including virtual private networks; virtual applications and operating systems 1428; and virtual clients 1430.

In one example, management layer 1432 may provide the functions described below. Resource provisioning 1434 provides dynamic procurement of computing resources and other resources that are utilized to perform tasks within the cloud computing environment. Metering and Pricing 1436 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1438 provides access to the cloud computing environment for consumers and system administrators. Service level management 1440 provides cloud computing resource allocation and management such that required service levels are met. Service Level Agreement (SLA) planning and fulfillment 1442 provide pre-arrangement for, and procurement of, cloud computing resources for which a future requirement is anticipated in accordance with an SLA.

Workloads layer 1444 provides examples of functionality for which the cloud computing environment may be utilized. Examples of workloads and functions which may be provided from this layer include: mapping and navigation 1446; software development and lifecycle management 1448; virtual classroom education delivery 1450; data analytics processing 1452; transaction processing 1454; and EDA parameter tuning 1456. Various embodiments of the present invention can utilize the cloud computing environment described with reference to FIGS. 13 and 14 to tune one or more parameters for a multi-stage EDA protocol via a cooperative co-evolutionary framework 200 that can exploit parameter knowledge (e.g., parameter importance, stage importance, and/or parameter interactions) extracted from archival data.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware based systems that perform the specified functions or acts or carry out combinations of special purpose hardware and computer instructions.

Figure 15:
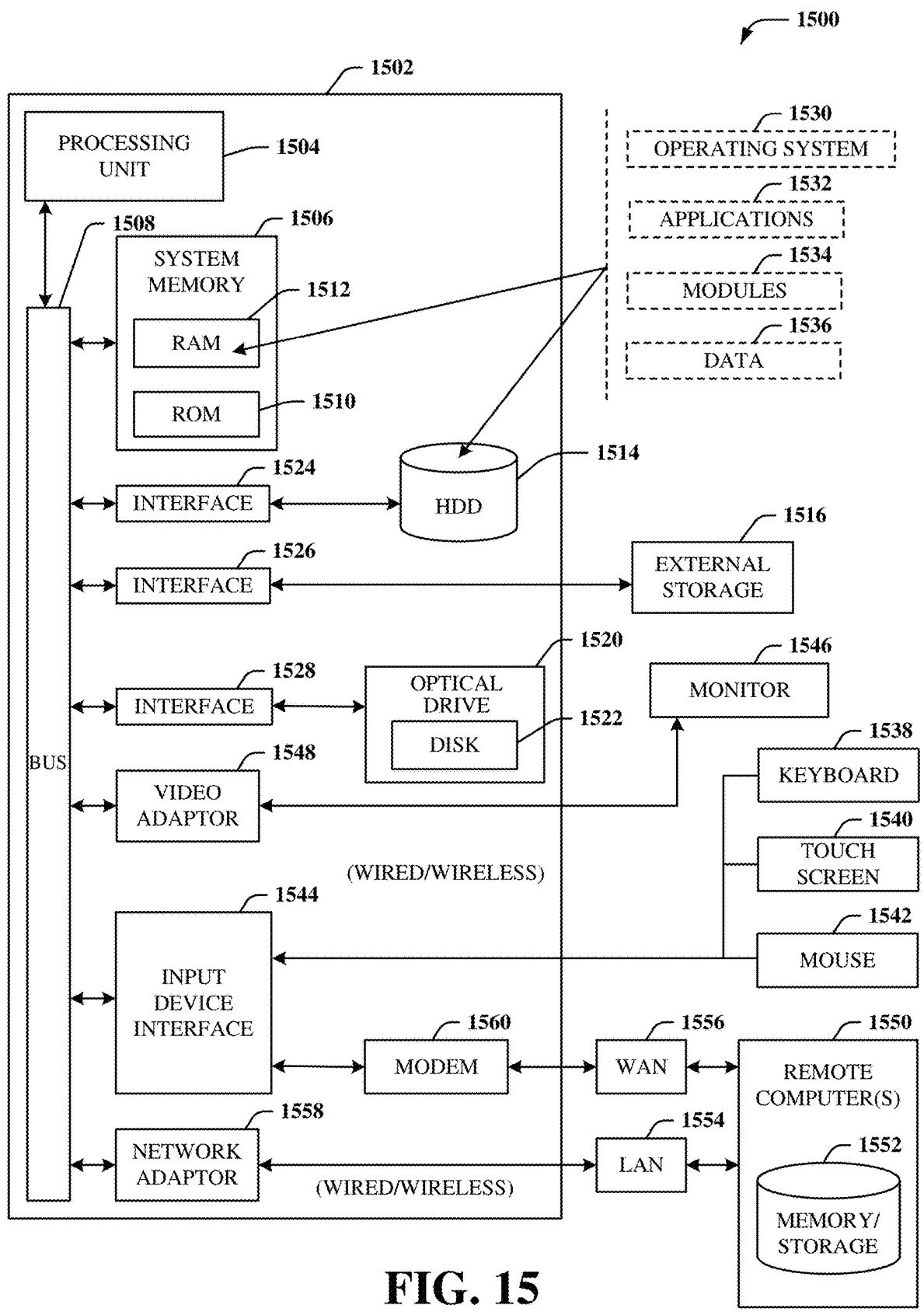
FIG. 15 illustrates a block diagram of an example, non-limiting operating environment in which one or more embodiments described herein can be facilitated.

In order to provide additional context for various embodiments described herein, FIG. 15 and the following discussion are intended to provide a general description of a suitable computing environment 1500 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, and/or the like, that perform particular tasks or implement particular abstract data types. Moreover, those skilled in the art will appreciate that the inventive methods can be practiced with other computer system configurations, including single-processor or multi-processor computer systems, minicomputers, mainframe computers, Internet of Things ("IoT") devices, distributed computing systems, as well as personal computers, handheld computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and nonremovable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory ("RAM"), read only memory ("ROM"), electrically erasable programmable read only memory ("EEPROM"), flash memory or other memory technology, compact disk read only memory ("CD-ROM"), digital versatile disk ("DVD"), Blu-ray disc ("BD") or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 15, the example environment 1500 for implementing various embodiments of the aspects described herein includes a computer 1502, the computer 1502 including a processing unit 1504, a system memory 1506 and a system bus 1508. The system bus 1508 couples system components including, but not limited to, the system memory 1506 to the processing unit 1504. The processing unit 1504 can be any of various commercially available processors. Dual microprocessors and other multi-processor architectures can also be employed as the processing unit 1504.

The system bus 1508 can be any of several types of bus structure that can further interconnect to a memory bus (with or without a memory controller), a peripheral bus, and a local bus using any of a variety of commercially available bus architectures. The system memory 1506 includes ROM 1510 and RAM 1512. A basic input/output system ("BIOS") can be stored in a non-volatile memory such as ROM, erasable programmable read only memory ("EPROM"), EEPROM, which BIOS contains the basic routines that help to transfer information between elements within the computer 1502, such as during startup. The RAM 1512 can also include a high-speed RAM such as static RAM for caching data.

The computer 1502 further includes an internal hard disk drive ("HDD") 1514 (e.g., EIDE, SATA), one or more external storage devices 1516 (e.g., a magnetic floppy disk drive ("FDD") 1516, a memory stick or flash drive reader, a memory card reader, a combination thereof, and/or the like) and an optical disk drive 1520 (e.g., which can read or write from a CD-ROM disc, a DVD, a BD, and/or the like). While the internal HDD 1514 is illustrated as located within the computer 1502, the internal HDD 1514 can also be configured for external use in a suitable chassis (not shown). Additionally, while not shown in environment 1500, a solid state drive ("SSD") could be used in addition to, or in place of, an HDD 1514. The HDD 1514, external storage device(s) 1516 and optical disk drive 1520 can be connected to the system bus 1508 by an HDD interface 1524, an external storage interface 1526 and an optical drive interface 1528, respectively. The interface 1524 for external drive implementations can include at least one or both of Universal Serial Bus ("USB") and Institute of Electrical and Electronics Engineers ("IEEE") 1394 interface technologies. Other external drive connection technologies are within contemplation of the embodiments described herein.

The drives and their associated computer-readable storage media provide nonvolatile storage of data, data structures, computer-executable instructions, and so forth. For the computer 1502, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1512, including an operating system 1530, one or more application programs 1532, other program modules 1534 and program data 1536. All or portions of the operating system, applications, modules, and/or data can also be cached in the RAM 1512. The systems and methods described herein can be implemented utilizing various commercially available operating systems or combinations of operating systems.

Computer 1502 can optionally comprise emulation technologies. For example, a hypervisor (not shown) or other intermediary can emulate a hardware environment for operating system 1530, and the emulated hardware can optionally be different from the hardware illustrated in FIG. 15. In such an embodiment, operating system 1530 can comprise one virtual machine ("VM") of multiple VMs hosted at computer 1502. Furthermore, operating system 1530 can provide runtime environments, such as the Java runtime environment or the .NET framework, for applications 1532. Runtime environments are consistent execution environments that allow applications 1532 to run on any operating system that includes the runtime environment. Similarly, operating system 1530 can support containers, and applications 1532 can be in the form of containers, which are lightweight, standalone, executable packages of software that include, e.g., code, runtime, system tools, system libraries and settings for an application.

Further, computer 1502 can be enable with a security module, such as a trusted processing module ("TPM"). For instance with a TPM, boot components hash next in time boot components, and wait for a match of results to secured values, before loading a next boot component. This process can take place at any layer in the code execution stack of computer 1502, e.g., applied at the application execution level or at the operating system ("OS") kernel level, thereby enabling security at any level of code execution.

A user can enter commands and information into the computer 1502 through one or more wired/wireless input devices, e.g., a keyboard 1538, a touch screen 1540, and a pointing device, such as a mouse 1542. Other input devices (not shown) can include a microphone, an infrared ("IR") remote control, a radio frequency ("RF") remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1504 through an input device interface 1544 that can be coupled to the system bus 1508, but can be connected by other interfaces, such as a parallel port, an IEEE 1394 serial port, a game port, a USB port, an IR interface, a BLUETOOTH® interface, and/or the like.

A monitor 1546 or other type of display device can be also connected to the system bus 1508 via an interface, such as a video adapter 1548. In addition to the monitor 1546, a computer typically includes other peripheral output devices (not shown), such as speakers, printers, a combination thereof, and/or the like.

The computer 1502 can operate in a networked environment using logical connections via wired and/or wireless communications to one or more remote computers, such as a remote computer(s) 1550. The remote computer(s) 1550 can be a workstation, a server computer, a router, a personal computer, portable computer, microprocessor-based entertainment appliance, a peer device or other common network node, and typically includes many or all of the elements described relative to the computer 1502, although, for purposes of brevity, only a memory/storage device 1552 is illustrated. The logical connections depicted include wired/wireless connectivity to a local area network ("LAN") 1554 and/or larger networks, e.g., a wide area network ("WAN") 1556. Such LAN and WAN networking environments are commonplace in offices and companies, and facilitate enterprise-wide computer networks, such as intranets, all of which can connect to a global communications network, e.g., the Internet.

When used in a LAN networking environment, the computer 1502 can be connected to the local network 1554 through a wired and/or wireless communication network interface or adapter 1558. The adapter 1558 can facilitate wired or wireless communication to the LAN 1554, which can also include a wireless access point ("AP") disposed thereon for communicating with the adapter 1558 in a wireless mode.

When used in a WAN networking environment, the computer 1502 can include a modem 1560 or can be connected to a communications server on the WAN 1556 via other means for establishing communications over the WAN 1556, such as by way of the Internet. The modem 1560, which can be internal or external and a wired or wireless device, can be connected to the system bus 1508 via the input device interface 1544. In a networked environment, program modules depicted relative to the computer 1502 or portions thereof, can be stored in the remote memory/storage device 1552. It will be appreciated that the network connections shown are example and other means of establishing a communications link between the computers can be used.

When used in either a LAN or WAN networking environment, the computer 1502 can access cloud storage systems or other network-based storage systems in addition to, or in place of, external storage devices 1516 as described above. Generally, a connection between the computer 1502 and a cloud storage system can be established over a LAN 1554 or WAN 1556 e.g., by the adapter 1558 or modem 1560, respectively. Upon connecting the computer 1502 to an associated cloud storage system, the external storage interface 1526 can, with the aid of the adapter 1558 and/or modem 1560, manage storage provided by the cloud storage system as it would other types of external storage. For instance, the external storage interface 1526 can be configured to provide access to cloud storage sources as if those sources were physically connected to the computer 1502.

The computer 1502 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, and/or the like), and telephone. This can include Wireless Fidelity ("Wi-Fi") and BLUETOOTH® wireless technologies. Thus, the communication can be a predefined structure as with a conventional network or simply an ad hoc communication between at least two devices.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
 a memory that stores computer executable components; and
 a processor that executes the computer executable components stored in the memory, wherein the computer executable components comprise:
  a knowledge extraction component that extracts parameter knowledge from archival data;
  a tuning component that tunes an electronic design automation protocol via a cooperative co-evolutionary optimization framework that shares the parameter knowledge across multiple stages of the electronic design automation protocol; and
  a cooperative co-evolutionary controller component that adaptively allocates computation resources to the multiple stages and coordinates a transfer of the parameter knowledge between a plurality of optimization components.

2. The system of claim 1, wherein the cooperative co-evolutionary controller component generates a priority ranking for the multiple stages and initializes weight values for a plurality of optimization graphs utilized by the plurality of optimization components.

3. The system of claim 1, wherein the cooperative co-evolutionary controller component assigns a first optimization component from the plurality of optimization components to a first stage from the multiple stages and a second optimization component from the plurality of optimization components to a second stage from the multiple stages.

4. The system of claim 3, wherein the first optimization component employs an optimization algorithm to generate a first parameter configuration for the first stage based on an optimization graph from a plurality of optimization graphs.

5. The system of claim 4, wherein the system further comprises:
a flow controller component that supplies an intermediate result to an execution of the electronic design automation protocol associated with a historic execution of the electronic design automation protocol that employed a second parameter configuration that is equivalent to the first parameter configuration.

6. The system of claim 5, where the flow controller component further terminates the execution of the electronic design automation protocol prior to a scheduled end based on a quality of result metric.

7. The system of claim 5, wherein the flow controller component employs a branch-and-bound strategy.

8. The system of claim 1, wherein adaptively allocating the computation resources to the multiple stages is based on a reward function.

9. A computer-implemented method, comprising:
extracting, by a system operatively coupled to a processor, parameter knowledge from archival data;
tuning, by the system, an electronic design automation protocol via a cooperative co-evolutionary optimization framework that shares the parameter knowledge across multiple stages of the electronic design automation protocol;
adaptively allocating, by the system, computation resources to the multiple stages; and
coordinating, by the system, a transfer of the parameter knowledge between a plurality of optimization engines.

10. The computer-implemented method of claim 9, further comprising:
generating, by the system, a priority ranking for the multiple stages; and
initializing, by the system, weight values for a plurality of optimization graphs utilized by the plurality of optimization engines.

11. The computer-implemented method of claim 9, further comprising:
employing, by the system, an optimization algorithm to generate a first parameter configuration for a first stage from the multiple stages based on an optimization graph from a plurality of optimization graphs; and
generating, by the system, a flow parameter configuration for the electronic design automation protocol, wherein the flow parameter configuration merges the first parameter configuration and a second parameter configuration for a second stage from the multiple stages.

12. The computer-implemented method of claim 11, further comprising:

supplying, by the system, an intermediate result to an execution of the electronic design automation protocol, wherein the intermediate result is associated with a historic execution of the electronic design automation protocol that employed a parameter configuration that is equivalent to the first parameter configuration.

13. The computer-implemented method of claim 12, further comprising:
terminating, by the system, the execution of the electronic design automation protocol prior to a scheduled end based on a quality of result metric.

14. The computer-implemented method of claim 13, where terminating the execution of the electronic design automation protocol is based on a branch-and-bound strategy.

15. The computer-implemented method of claim 9, wherein adaptively allocating the computation resources to the multiple stages is based on a reward function.

16. A computer program product for electronic design automation parameter tuning, the computer program product comprising a computer readable storage medium having program instructions embodied therewith, the program instructions executable by a processor to cause the processor to:
extract parameter knowledge from archival data;
tune, an electronic design automation protocol via a cooperative co-evolutionary optimization framework that shares the across multiple stages of the electronic design automation protocol;
coordinate a transfer of the parameter knowledge between a plurality of optimization engines; and
adaptively allocate, by the processor, computation resources to the multiple stages.

17. The computer program product of claim 16, wherein the program instructions further cause the processor to:
generate, by the processor, a priority ranking for the multiple stages; and
initialize, by the processor, weight values for a plurality of optimization graphs utilized by the plurality of optimization engines.

18. The computer program product of claim 17, wherein the program instructions further cause the processor to:
employ, by the processor, an optimization algorithm to generate a first parameter configuration for a first stage from the multiple stages; and
generate, by the processor, a flow parameter configuration for the electronic design automation protocol, wherein the flow parameter configuration merges the first parameter configuration and a second parameter configuration for a second stage from the multiple stages.

19. The computer program product of claim 18, wherein the program instructions further cause the processor to:
supply, by the processor, an intermediate result to an execution of the electronic design automation protocol, wherein the intermediate result is associated with a historic execution of the electronic design automation protocol that employed a parameter configuration that is equivalent to the first parameter configuration; and
terminate, by the processor, the execution of the electronic design automation protocol prior to a scheduled end based on a quality of result metric.

20. The computer program product of claim 16, wherein adaptively allocating the computation resources to the multiple stages is based on a reward function.

* * * * *